United States Patent
Choi et al.

(10) Patent No.: US 10,033,974 B2
(45) Date of Patent: Jul. 24, 2018

(54) ELECTRONIC DEVICE HAVING A COLOR FILTER AND METHOD OF FORMING THE SAME

(71) Applicants: Ha-Kyu Choi, Yongin-si (KR); Chang-Rok Moon, Seoul (KR); June-Taeg Lee, Suwon-si (KR); Hyung-Jun Kim, Hwaseong-si (KR)

(72) Inventors: Ha-Kyu Choi, Yongin-si (KR); Chang-Rok Moon, Seoul (KR); June-Taeg Lee, Suwon-si (KR); Hyung-Jun Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/797,656

(22) Filed: Jul. 13, 2015

(65) Prior Publication Data

US 2016/0065914 A1    Mar. 3, 2016

(30) Foreign Application Priority Data

Aug. 29, 2014    (KR) .......................... 10-2014-0114477

(51) Int. Cl.
   *G02B 5/20*        (2006.01)
   *H01L 27/146*      (2006.01)
   *H04N 9/04*        (2006.01)

(52) U.S. Cl.
   CPC ............. *H04N 9/045* (2013.01); *G02B 5/201* (2013.01); *H01L 27/14621* (2013.01)

(58) Field of Classification Search
   None
   See application file for complete search history.

(56) References Cited

U.S. PATENT DOCUMENTS

| | | | |
|---|---|---|---|
| 7,875,947 B2 | 1/2011 | Moon et al. | |
| 8,144,270 B2 | 3/2012 | Wang et al. | |
| 8,427,563 B2 | 4/2013 | Kim et al. | |
| 8,487,030 B2 | 7/2013 | Lee et al. | |
| 8,492,056 B2 | 7/2013 | Chen | |
| 2007/0134474 A1* | 6/2007 | Ahn | G02B 5/22 428/212 |
| 2010/0053387 A1* | 3/2010 | Kim | H01L 27/14621 348/273 |
| 2011/0134288 A1* | 6/2011 | Kasai | H04N 9/045 348/241 |
| 2013/0075851 A1* | 3/2013 | Terai | H01L 27/14621 257/432 |
| 2013/0100324 A1* | 4/2013 | Ogino | H01L 27/14621 348/294 |

FOREIGN PATENT DOCUMENTS

| | | |
|---|---|---|
| JP | 7-294899 A | 11/1995 |
| JP | 2012-142249 A | 7/2012 |
| KR | 10-2010-0024759 A | 3/2010 |

* cited by examiner

*Primary Examiner* — Mark T Monk
(74) *Attorney, Agent, or Firm* — Sughrue Mion, PLLC

(57) ABSTRACT

An electronic device is provided. The electronic device includes a first inorganic color filter including a first surface on which light is incident and a second surface opposite the first surface; and a first organic color filter disposed on the first surface of the first inorganic color filter.

21 Claims, 25 Drawing Sheets

FIG. 13

| $P_R$ | $P_G$ | $P_B$ | $P_R$ | $P_G$ | $P_B$ | $P_R$ | $P_G$ |
|---|---|---|---|---|---|---|---|
| $P_R$ | $P_G$ | $P_B$ | $P_R$ | $P_G$ | $P_B$ | $P_R$ | $P_G$ |
| $P_R$ | $P_G$ | $P_B$ | $P_R$ | $P_G$ | $P_B$ | $P_R$ | $P_G$ |
| $P_R$ | $P_G$ | $P_B$ | $P_R$ | $P_G$ | $P_B$ | $P_R$ | $P_G$ |
| $P_R$ | $P_G$ | $P_B$ | $P_R$ | $P_G$ | $P_B$ | $P_R$ | $P_G$ |
| $P_R$ | $P_G$ | $P_B$ | $P_R$ | $P_G$ | $P_B$ | $P_R$ | $P_G$ |
| $P_R$ | $P_G$ | $P_B$ | $P_R$ | $P_G$ | $P_B$ | $P_R$ | $P_G$ |
| $P_R$ | $P_G$ | $P_B$ | $P_R$ | $P_G$ | $P_B$ | $P_R$ | $P_G$ |

II — II'

ELECTRONIC DEVICE HAVING A COLOR FILTER AND METHOD OF FORMING THE SAME

CROSS-REFERENCE TO RELATED APPLICATION

This application claims priority from Korean Patent Application No. 10-2014-0114477 filed on Aug. 29, 2014, the disclosure of which is hereby incorporated by reference in its entirety.

BACKGROUND

Field

Apparatuses and methods consistent with exemplary embodiments relate to an electronic device including a color filter and a method of forming the same.

Description of Related Art

An electronic device, such as an image sensor or a display device, includes color filter. The color filter may filter incident light according to a wavelength. Examples of a color filter may include an organic color filter and an inorganic filter. Various studies on the electronic device including the color filter are being conducted to reduce a loss of light due to the color filter and optical crosstalk between adjacent pixels.

SUMMARY

One or more exemplary embodiments provide an electronic device in which a loss of light due to a color filter is reduced and a method of forming the same.

Further, one or more exemplary embodiments also provide an electronic device including a color filter having a high transmissivity and a method of forming the same.

Further still, one or more exemplary embodiments provide an electronic device in which optical cross talk between adjacent pixels is reduced and a method of forming the same.

According to an aspect of an exemplary embodiment, there is provided an electronic device including a first inorganic color filter including a first surface on which light is incident and a second surface opposite the first surface; and a first organic color filter disposed on the first surface of the first inorganic color filter.

A thickness of the first organic color filter in a direction orthogonal to the first surface may be less than a thickness of the first inorganic color filter.

The device may include a second organic color filter disposed on the second surface of the first inorganic color filter.

A thickness of the second organic color filter in a direction orthogonal to the first surface may be less than a thickness of the first organic color filter.

The device may further comprise a second inorganic color filter disposed between the first inorganic color filter and the first organic color filter; and an intermediate organic color filter disposed between the first inorganic color filter and the second inorganic color filter.

A thickness of the intermediate organic color filter in a direction orthogonal to the first surface may be less than a thickness of the first organic color filter.

A thickness of the second inorganic color filter in a direction orthogonal to the first surface may be greater than a thickness of the intermediate organic color filter.

A thickness of the second inorganic color filter in a direction orthogonal to the first surface may be greater than a vertical thickness of the first organic color filter.

According to an aspect of another exemplary embodiment, there is provided an electronic device including a substrate; a first inorganic color filter disposed on the substrate; and a first organic color filter disposed on the first inorganic color filter so that the first inorganic color filter is interposed between the substrate and the first organic color filter, wherein light penetrating the first organic color filter is incident on the first inorganic color filter.

A side surface of the first inorganic color filter may be aligned with a side of the first organic color filter in a direction orthogonal to the substrate.

The device may further include a second inorganic color filter disposed between the first inorganic color filter and the first organic color filter; and an intermediate organic color filter disposed between the first inorganic color filter and the second inorganic color filter, wherein a side surface of the intermediate organic color filter is aligned with a side of the first organic color filter in a direction orthogonal to the substrate.

A thickness of the second inorganic color filter may be less than a thickness of the first organic color filter in the direction orthogonal to the substrate.

The device may further comprise a second organic color filter disposed between the substrate and the first inorganic color filter.

A thickness of the second organic color filter may be less than a thickness of the first organic color filter in the direction orthogonal to the substrate.

A side surface of the second organic color filter may be aligned with the side of the first organic color filter in the direction orthogonal to the substrate.

According to an aspect of another exemplary embodiment, there is provided an electronic device including a substrate including a first pixel area and a second pixel area; a first organic color filter disposed on the first pixel area of the substrate; a second organic color filter disposed on the second pixel area of the substrate; and an inorganic color filter disposed between the substrate and the second organic color filter, wherein a progress direction of the light penetrating the inorganic color filter is a direction orthogonal to the substrate.

A thickness of the second organic color filter may be less than a thickness of the first organic color filter in a direction orthogonal to the substrate.

A level of a surface of the second organic color filter in a direction away from the substrate may be the same as a level of a surface of the first organic color filter in the direction away from the substrate.

The device may further include a metal pattern disposed between the inorganic color filter and the first organic color filter.

A thickness of the metal pattern in a direction orthogonal to the substrate may decrease as a distance in a direction parallel to the substrate increases from the inorganic color filter.

A width in a direction parallel to the substrate of a surface of the inorganic color filter toward the substrate may be the same as a width in the direction parallel to the substrate of a surface of the first organic color filter toward to substrate.

A width in a direction parallel to the substrate of a surface of the second organic color filter away from the substrate may be the same as the width in the direction parallel to the substrate of a surface of the first organic color filter away from the substrate.

The first organic color filter and the second organic color filter may extend over and on the metal pattern.

A side surface of the second organic color filter may directly contact a side surface of the first organic color filter over and on the metal pattern.

According to an aspect of another exemplary embodiment, there is provided an electronic device including an inorganic color filter disposed on a substrate; a first micro-lens disposed on the inorganic color filter; and a first organic color filter disposed between the inorganic color filter and the first micro-lens.

A width of the first micro-lens in a direction parallel to the substrate may be the same as a width in the direction parallel to the substrate of a surface of the first organic color filter that is away from the substrate.

The device may further include a second micro-lens disposed abreast with the first micro-lens; and a second organic color filter disposed between the inorganic color filter and the second micro-lens.

A wavelength range of light penetrating the second organic color filter may be different from a wavelength range of light penetrating the first organic color filter.

A thickness of the second organic color filter may be the same as a thickness of the first organic color filter in a direction orthogonal to the substrate.

The device may further include a photoelectric conversion device disposed between the substrate and the inorganic color filter.

BRIEF DESCRIPTION OF THE DRAWINGS

The foregoing and other aspects will be apparent from the more particular description of exemplary embodiments, as illustrated in the accompanying drawings in which:

FIG. 13 is a view showing an arrangement of pixel areas in an electronic device in accordance with another exemplary embodiment;

DETAILED DESCRIPTION OF EXEMPLARY EMBODIMENTS

Various exemplary embodiments will now be described more fully with reference to the accompanying drawings in which some exemplary embodiments are shown. These inventive concepts may, however, be embodied in different forms and should not be construed as limited to the exemplary embodiments set forth herein. Rather, these exemplary embodiments are provided so that this disclosure is thorough and complete and fully conveys the inventive concept to those skilled in the art.

Hereinafter, like numerals refer to like elements throughout the specification and drawings. The drawings are not necessarily to scale and the lengths and thicknesses of layers and regions may be exaggerated for clarity. In addition, it will be understood that when a first element is referred to as being "on" a second element, the first element may be directly on the second element, or a third element may be interposed between the first element and the second element.

It will be understood that, although the terms "first," "second," etc. may be used herein to describe various elements, these elements should not be limited by these terms. These terms are only used to distinguish one element from another. For example, a "first" element could be termed a second element, and similarly, a "second" element could be termed a first element, without departing from the scope of the inventive concept.

The terminology used herein is for the purpose of describing particular exemplary embodiments only and is not intended to be limiting of the present inventive concept. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein are to be interpreted as is customary in the art to which this inventive concept belongs. It will be further understood that terms in common usage should also be interpreted as is customary in the relevant art and not in an idealized or overly formal sense unless expressly so defined herein.

Figure 1:
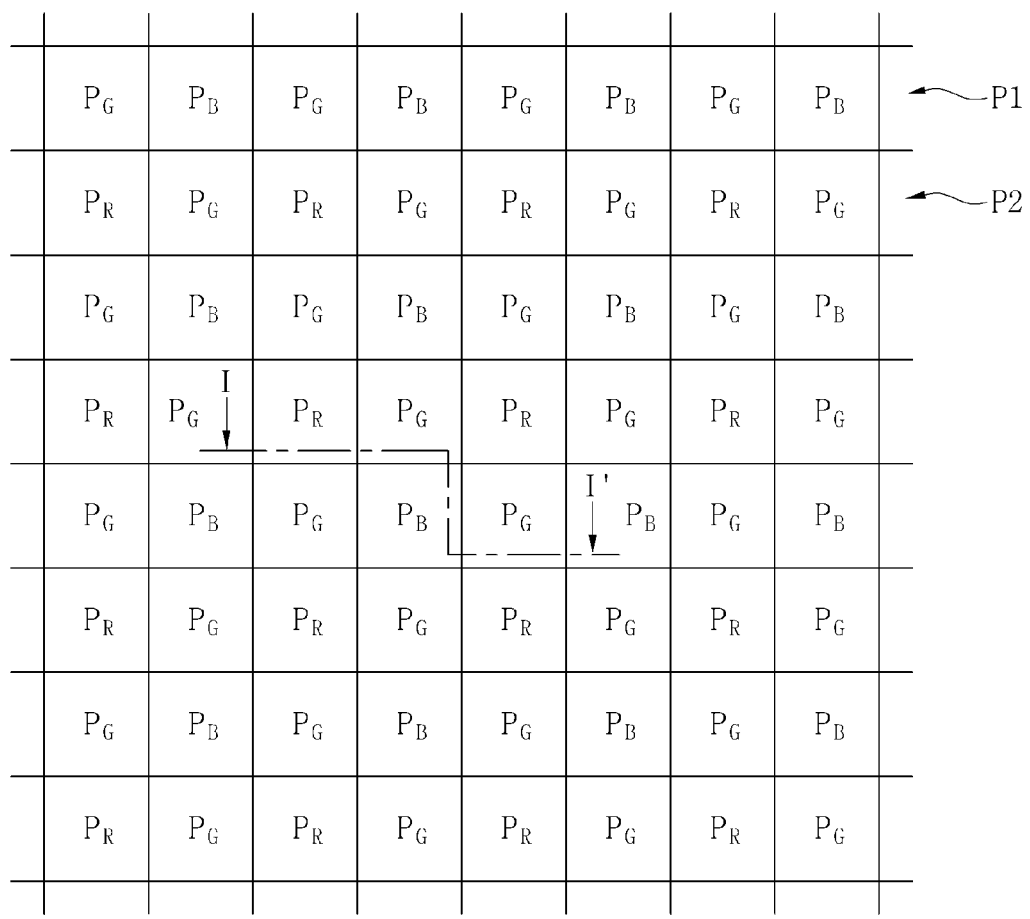
FIG. 1 is a view showing an arrangement of pixel areas in an electronic device in accordance with an exemplary embodiment.
Figure 2:
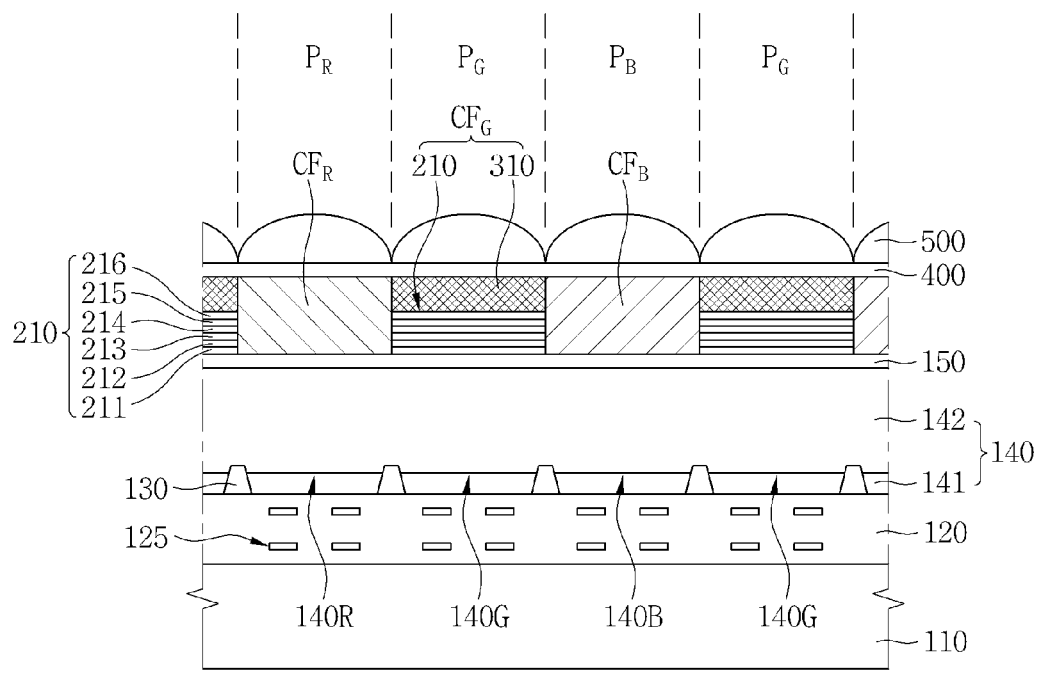
FIG. 2 is a cross-sectional view showing the electronic device taken along line I-I' of FIG. 1 in accordance with an exemplary embodiment.

FIG. 1 is a view showing an arrangement of pixel areas in an electronic device in accordance with an exemplary embodiment. FIG. 2 is a cross-sectional view showing the electronic device taken along line I-I' of FIG. 1 in accordance with an exemplary embodiment.

Referring to FIGS. 1 and 2, the electronic device may include a support substrate 110, a interlayer insulating layer 120, isolation structures 130, red photoelectric conversion devices 140R, blue photoelectric conversion devices 140B, green photoelectric conversion devices 140G, a buffer layer 150, red color filters $CF_R$, blue color filters $CF_B$, green color filters $CF_G$, a planarization layer 400, and micro-lenses 500. For example, the electronic device in accordance with an exemplary embodiment may be an image sensor.

The support substrate 110 may include a semiconductor substrate, a glass substrate, or a metal substrate, or a combination of these substrates. The support substrate 110 may include red pixel areas $P_R$, blue pixel areas $P_B$, and green pixel areas $P_G$.

The green pixel areas $P_G$ may be arranged in a crisscross pattern. For example, the green pixel areas $P_G$ may be disposed in a zigzag shape. That is, as shown in FIG. 1, the green pixel areas $P_G$ may be arranged along diagonal directions. The red pixel area $P_R$ may be disposed between the green pixel areas $P_G$. The blue pixel area $P_B$ may be disposed between the green pixel areas $P_G$. The red pixel areas $P_R$ and the blue pixel areas $P_B$ may be arranged in a crisscross pattern. For example, according to the electronic device in accordance with an exemplary embodiment, first rows P1, in which the green pixel areas $P_G$ and the blue pixel areas $P_B$ are alternately arranged, and second rows P2, in which the red pixel areas $P_R$ and the green pixel areas $P_G$ are alternately arranged, may be repeatedly disposed.

An area size of each green pixel area $P_G$ may be the same as an area size of each red pixel area $P_R$. A horizontal width of each green pixel area $P_G$ may be the same as a horizontal width of each red pixel area $P_R$. The area size of each green pixel area $P_G$ may be the same as an area size of each blue pixel area $P_B$. The horizontal width of each green pixel area $P_G$ may be the same as a horizontal width of each blue pixel area $P_B$. For example, the red pixel area $P_R$, the blue pixel area $P_B$, and the green pixel area $P_G$ may have a rectangular shape.

The interlayer insulating layer 120 may be disposed on the support substrate 110. The interlayer insulating layer 120 may include an insulating material. For example, the interlayer insulating layer 120 may include silicon oxide or silicon nitride. Internal interconnections 125 may be disposed in the interlayer insulating layer 120. For example, the interlayer insulating layer 120 may have a multi-layered structure.

The isolation structures 130 may be disposed on the interlayer insulating layer 120. The isolation structures 130 may be disposed between the red pixel areas $P_R$, the blue pixel areas $P_B$, and the green pixel areas $P_G$. The isolation structure 130 may include an insulating material. For example, the isolation structure 130 may include silicon oxide.

The red photoelectric conversion devices 140R, the blue photoelectric conversion devices 140B, and the green photoelectric conversion devices 140G may absorb incident light to generate/store electric charges corresponding to the amount of the absorbed light. The red photoelectric conversion devices 140R may be disposed on the red pixel areas $P_R$. The blue photoelectric conversion devices 140B may be disposed on the blue pixel areas $P_B$. The green photoelectric conversion devices 140G may be disposed on the green pixel areas $P_G$.

Each of the red photoelectric conversion devices 140R, the blue photoelectric conversion devices 140B, and the green photoelectric conversion devices 140G may include a photodiode 140. The photodiode 140 may include a first impurity area 141 and a second impurity area 142.

The first impurity area 141 may be disposed near the interlayer insulating layer 120. The first impurity area 141 may be disposed between the isolation structures 130. The second impurity area 142 may be disposed on the first impurity area 141. For example, the second impurity area 142 may cross the isolation structures 130. The second impurity areas 142 of the adjacent pixel areas $P_R$, $P_B$, and $P_G$ may be connected.

The second impurity area 142 may include a conductive impurity different from the first impurity area 141. For example, the first impurity area 141 may include an N-type impurity and the second impurity area 142 may include a P-type impurity. Alternatively, the first impurity area 141 may include a P-type impurity and the second impurity area 142 may include an N-type impurity.

The buffer layer 150 may be disposed on the red photoelectric conversion devices 140R, the blue photoelectric conversion devices 140B, and the green photoelectric conversion devices 140G. The buffer layer 150 may include an insulating material. For example, the buffer layer 150 may include silicon oxide.

The red color filters $CF_R$, the blue color filters $CF_B$, and the green color filters $CF_G$ may filter incident light according to a wavelength. For example, a wavelength range of the light penetrating the red color filter $CF_R$ may be the same as a wavelength range of the light that presents a red color. For example, a wavelength range of the light penetrating the blue color filter $CF_B$ may be the same as a wavelength range of the light that presents a blue color. For example, a wavelength range of the light penetrating the green color filter $CF_G$ may be the same as a wavelength range of the light that presents a green color.

The red color filters $CF_R$ may be disposed on the red pixel areas $P_R$. The red color filters $CF_R$ may be disposed on the red photoelectric conversion devices 140R. The light that passes through the red color filter $CF_R$ may be incident on the red photoelectric conversion device 140R.

The red color filter $CF_R$ may be an organic color filter (OCF). For example, the red color filter $CF_R$ may include a photoresist or a resin having a pigment that absorbs light that presents colors except a red color.

An area size of each red color filter $CF_R$ may be the same as the area size of each red pixel area $P_R$. A maximum horizontal width of each red color filter $CF_R$ may be the same as a horizontal width of each red pixel area $P_R$.

The blue color filters $CF_B$ may be disposed on the blue pixel areas $P_B$. The blue color filters $CF_B$ may be disposed on the blue photoelectric conversion devices 140B. The light that passes through the blue color filter $CF_B$ may be incident on the blue photoelectric conversion device 140B.

The blue color filter $CF_B$ may be an OCF. For example, the blue color filter $CF_B$ may include a photoresist or a resin having a pigment that absorbs light that presents colors except a blue color.

An area size of each blue color filter $CF_B$ may be the same as the area size of each blue pixel area $P_B$. The area size of each blue color filter $CF_B$ may be the same as the area size of each red color filter $CF_R$. A maximum horizontal width of each blue color filter $CF_B$ may be the same as a horizontal width of each blue pixel area $P_B$. The maximum horizontal width of each blue color filter $CF_B$ may be the same as the maximum horizontal width of each red color filter $CF_R$.

A vertical thickness of each blue color filter $CF_B$ may be the same as a vertical thickness of each red color filter $CF_R$. A level of an upper surface of each blue color filter $CF_B$ may be the same as a level of an upper surface of each red color filter $CF_R$.

The green color filters $CF_G$ may be disposed on the green pixel areas $P_G$. The green color filters $CF_G$ may be disposed on the green photoelectric conversion devices 140G. The light that passes through the green color filter $CF_G$ may be incident on the green photoelectric conversion device 140G. Each green color filter $CF_G$ may include a green inorganic color filter 210 and a green organic color filter 310.

The green inorganic color filter 210 may be disposed on the buffer layer 150. The green inorganic color filter 210 may be an inorganic color filter (ICF). The green inorganic color filter 210 may have a multi-layered structure. For example, the green inorganic color filter 210 may include a first green inorganic color filter layer 211, a second green inorganic color filter layer 212, a third green inorganic color filter layer 213, a fourth green inorganic color filter layer 214, a fifth green inorganic color filter layer 215, and a sixth green inorganic color filter layer 216. Here, six layers are described; however, the number of layers is not particularly limited and may be more or less than six.

The first green inorganic color filter layer 211 may be disposed near the buffer layer 150. The second green inorganic color filter layer 212 may be disposed on the first green inorganic color filter layer 211. The third green inorganic color filter layer 213 may be disposed on the second green inorganic color filter layer 212. The fourth green inorganic color filter layer 214 may be disposed on the third green inorganic color filter layer 213. The fifth green inorganic color filter layer 215 may be disposed on the fourth green inorganic color filter layer 214. The sixth green inorganic color filter layer 216 may be disposed on the fifth green inorganic color filter layer 215.

A refractive index of the second green inorganic color filter layer 212 may be different from a refractive index of the first green inorganic color filter layer 211. For example, the second green inorganic color filter layer 212 may have a refractive index higher than the first green inorganic color filter layer 211. A refractive index of the third green inorganic color filter layer 213 may be different from a refractive index of the second green inorganic color filter layer 212. For example, the third green inorganic color filter layer 213 may have a refractive index lower than the second green inorganic color filter layer 212. The refractive index of the third green inorganic color filter layer 213 may be different from the refractive index of the first green inorganic color filter layer 211. A refractive index of the fourth green inorganic color filter layer 214 may be different from the refractive index of the third green inorganic color filter layer 213. For example, the fourth green inorganic color filter layer 214 may have a refractive index higher than the third green inorganic color filter layer 213. The refractive index of the fourth green inorganic color filter layer 214 may be different from the refractive index of the second green inorganic color filter layer 212. A refractive index of the fifth green inorganic color filter layer 215 may be different from the refractive index of the fourth green inorganic color filter layer 214. For example, the fifth green inorganic color filter layer 215 may have a refractive index lower than the fourth green inorganic color filter layer 214. The refractive index of the fifth green inorganic color filter layer 215 may be different from the refractive index of the third green inorganic color filter layer 213. A refractive index of the sixth green inorganic color filter layer 216 may be different from the refractive index of the fifth green inorganic color filter layer 215. For example, the sixth green inorganic color filter layer 216 may have a refractive index higher than the fifth green inorganic color filter layer 215. The refractive index of the sixth green inorganic color filter layer 216 may be different from the refractive index of the fourth green inorganic color filter layer 214.

A side surface of the first green inorganic color filter layer 211 may be vertically aligned with a side surface of the second green inorganic color filter layer 212. The side surface of the second green inorganic color filter layer 212 may be vertically aligned with a side surface of the third green inorganic color filter layer 213. The side surface of the third green inorganic color filter layer 213 may be vertically aligned with a side surface of the fourth green inorganic color filter layer 214. The side surface of the fourth green inorganic color filter layer 214 may be vertically aligned with a side surface of the fifth green inorganic color filter layer 215. The side surface of the fifth green inorganic color filter layer 215 may be vertically aligned with a side surface of the sixth green inorganic color filter layer 216.

The green inorganic color filter 210 may include an insulating material. For example, the first green inorganic color filter layer 211, the second green inorganic color filter layer 212, the third green inorganic color filter layer 213, the fourth green inorganic color filter layer 214, the fifth green inorganic color filter layer 215, and the sixth green inorganic color filter layer 216 may include silicon oxide, silicon nitride, or silicon oxynitride. For example, the first through sixth green inorganic color filter layers 211-216 may all include silicon oxide, silicon nitride, or silicon oxynitride, or the first through sixth green inorganic color filter layers 211-216 may include different materials, such that, for example, the first green inorganic color filter layer 211 may include silicon oxide, the second green inorganic color filter layer 212 may include silicon nitride, the third green inorganic color filter layer 213 may include silicon oxynitride, the fourth green inorganic color filter layer 214 may include silicon nitride, etc.

An area size of the green inorganic color filter 210 may be the same as the area size of each green pixel area $P_G$. The area size of the green inorganic color filter 210 may be the same as the area size of each red color filter $CF_R$. The area size of the green inorganic color filter 210 may be the same as the area size of each blue color filter $CF_B$. A maximum horizontal width of the green inorganic color filter 210 may be the same as the horizontal width of each green pixel area $P_G$. The maximum horizontal width of the green inorganic color filter 210 may be the same as the maximum horizontal width of each red color filter $CF_R$. The maximum horizontal width of the green inorganic color filter 210 may be the same as the maximum horizontal width of each blue color filter $CF_B$.

A vertical thickness of the green inorganic color filter 210 may be less than the vertical thickness of the red color filter $CF_R$. The vertical thickness of the green inorganic color filter 210 may be less than the vertical thickness of the blue color filter $CF_B$. A level of a lower surface of the green inorganic color filter 210 may be the same as a level of a lower surface of the red color filter $CF_R$. The level of the lower surface of the green inorganic color filter 210 may be the same as a level of a lower surface of the blue color filter $CF_B$. A level of an upper surface of the green inorganic color filter 210 may be lower than a level of an upper surface of the red color filter $CF_R$. The level of the upper surface of the green inorganic color filter 210 may be lower than a level of an upper surface of the blue color filter $CF_B$.

The green organic color filter 310 may be disposed on the green inorganic color filter 210. The green organic color filter 310 may be an OCF. The green organic color filter 310 may be a single layered structure. For example, the green organic color filter 310 may include a photoresist or a resin, in which a pigment that absorbs light that presents colors except a green color is spread.

A side surface of the green inorganic color filter 210 may be vertically aligned with a side surface of the green organic color filter 310. For example, the side surface of the sixth green inorganic color filter layer 216 may be vertically aligned with the side surface of the green organic color filter 310.

An area size of the green organic color filter 310 may be the same as the area size of the green pixel area $P_G$. The area size of the green organic color filter 310 may be the same as the area size of the green inorganic color filter 210. A maximum horizontal width of the green organic color filter 310 may be the same as the horizontal width of the green pixel area $P_G$. The maximum horizontal width of the green organic color filter 310 may be the same as the maximum horizontal width of the green inorganic color filter 210.

A vertical thickness of the green organic color filter 310 may be less than the vertical thickness of the green inorganic color filter 210. A level of an upper surface of the green organic color filter 310 may be the same as the level of the upper surface of the red color filter $CF_R$. The level of the upper surface of the green organic color filter 310 may be the same as the level of the upper surface of the blue color filter $CF_B$.

According to the electronic device in accordance with the above-described exemplary embodiment, each of the green color filters $CF_G$ may have a structure in which the green inorganic color filter 210 and the green organic color filter 310 are stacked. In the electronic device in accordance with the above-described exemplary embodiment, the vertical thickness of the green organic color filter 310 may be less than the vertical thickness of the red color filters $CF_R$ and the vertical thickness of the blue color filters $CF_B$. In general, the OCF has a transmissivity lower than the ICF. That is, in the electronic device in accordance with the above-described exemplary embodiment, the green color filters $CF_G$ may have a relatively high transmissivity. Therefore, in the electronic device in accordance with the above-described exemplary embodiment, a loss of light which is incident on the green color filters $CF_G$ may be reduced.

Further, in the electronic device in accordance with the above-described exemplary embodiment, the green organic color filter 310 may be disposed on a surface of the green inorganic color filter 210 on which light is incident. That is, in the electronic device in accordance with the above-described exemplary embodiment, the light filtered by the green organic color filter 310 may be incident on the green inorganic color filter 210. Therefore, in the electronic device in accordance with the above-described exemplary embodiment, optical crosstalk between adjacent pixel areas $P_R$, $P_B$, and $P_G$ may be reduced. In addition, in the electronic device in accordance with the above-described exemplary embodiment, a generation of a flare due to the green inorganic color filter 210 may be reduced.

According to the electronic device in accordance with the above-described exemplary embodiment, the green color filter $CF_G$ has a structure in which the ICF and the OCF are stacked. However, in the electronic device in accordance with the above-described exemplary embodiment, alternatively, the red color filter $CF_R$ or the blue color filter $CF_B$ may have a structure in which the ICF and the OCF are stacked. That is, in some exemplary embodiments, for example, the red color filter $CF_R$ may have a structure in which the ICF and the OCF are stacked, and the blue color filter $CF_B$ and the green color filter $CF_G$ may have a structure in which the ICF and the OCF are not stacked, and in still other exemplary embodiments, for example, the blue color filter $CF_B$ may have a structure in which the ICF and the OCF are stacked, and the red color filter $CF_R$ and the green color filter $CF_G$ may have a structure in which the ICF and the OCF are not stacked. In the electronic device in accordance with the above-described exemplary embodiments, the pixel areas $P_R$, $P_B$, and $P_G$ of the color filters $CF_R$, $CF_B$, and $CF_G$ having a structure in which the ICF and the OCF are stacked may be disposed in a zigzag shape. That is, the pixel areas $P_R$, $P_B$, and $P_G$ of the color filters $CF_R$, $CF_B$, and $CF_G$ having a structure in which the ICF and the OCF are stacked may be disposed along diagonal directions.

The planarization layer 400 may be disposed on the red color filters $CF_R$, the blue color filters $CF_B$, and the green color filters $CF_G$. A level of an upper surface of the planarization layer 400 on the red color filter $CF_R$ may be the same as a level of an upper surface of the planarization layer 400 on the blue color filter $CF_B$. The level of the upper surface of the planarization layer 400 on the blue color filter $CF_B$ may be the same as a level of an upper surface of the planarization layer 400 on the green color filter $CF_G$. The planarization layer 400 may include an insulating material. For example, the planarization layer 400 may have a high transmissivity.

The micro-lenses 500 may be disposed on the planarization layer 400. The micro-lenses 500 may be disposed on the red pixel areas $P_R$, the blue pixel areas $P_B$, and the green pixel areas $P_G$. The micro-lenses 500 may be disposed on the red photoelectric conversion devices 140R, the blue photoelectric conversion devices 140B, and the green photoelectric conversion devices 140G. The micro-lenses 500 may be disposed on the red color filters $CF_R$, the blue color filters $CF_B$, and the green color filters $CF_G$.

A horizontal width of a lower surface of each micro-lens 500 may be the same as the maximum horizontal width of the corresponding pixel area $P_R$, $P_B$, or $P_G$. The horizontal width of the lower surface of each micro-lens 500 may be the same as the maximum horizontal width of the upper surface of each color filter $CF_R$, $CF_B$, or $CF_G$.

Figure 3:
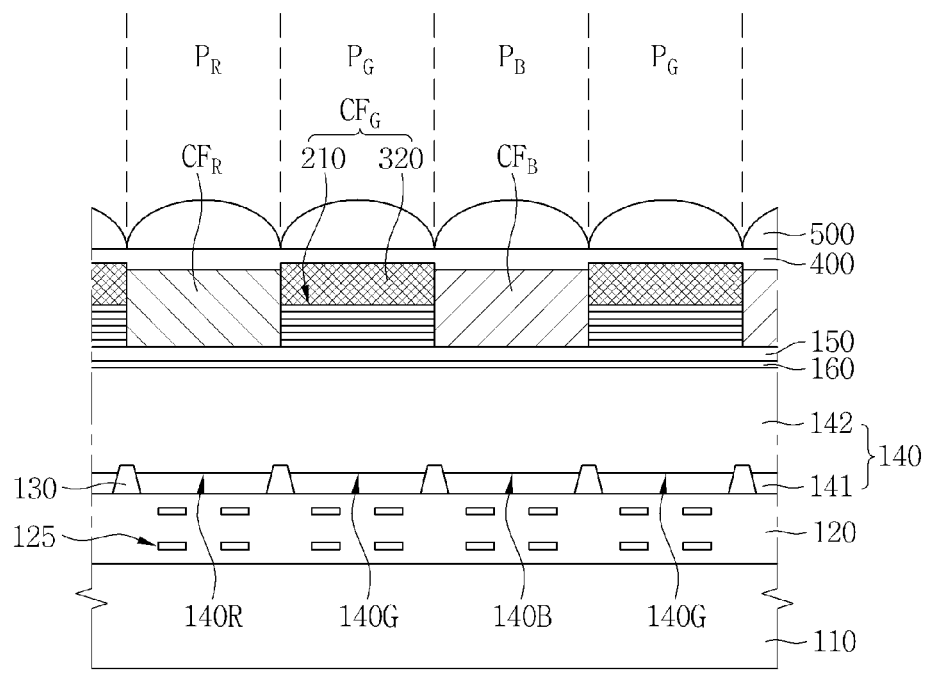
FIGS. 3-12 are cross-sectional views showing an electronic device in accordance with exemplary embodiments.

FIG. 3 is a cross-sectional view showing an electronic device in accordance with another exemplary embodiment.

Referring to FIG. 3, the electronic device in accordance with the exemplary embodiment may include a support substrate 110, an interlayer insulating layer 120, isolation structures 130, red photoelectric conversion devices 140R, blue photoelectric conversion devices 140B, green photoelectric conversion devices 140G, a buffer layer 150, an anti-reflective layer 160, red color filters $CF_R$, blue color filters $CF_B$, green color filters $CF_G$, a planarization layer 400, and micro-lenses 500.

Internal interconnections 125 may be disposed in the interlayer insulating layer 120. Each of the red photoelectric conversion devices 140R, the blue photoelectric conversion devices 140B, and the green photoelectric conversion devices 140G may include a photodiode 140. The photodiode 140 may include a first impurity area 141 and a second impurity area 142.

The support substrate 110 may include red pixel areas $P_R$, blue pixel areas $P_B$, and green pixel areas $P_G$. The anti-reflective layer 160 may be located on the red photoelectric conversion devices 140R, the blue photoelectric conversion devices 140B, and the green photoelectric conversion devices 140G. For example, the anti-reflective layer 160 may include silicon nitride, tantalum oxide, or hafnium oxide (HfO). The anti-reflective layer 160 may have a multi-layered structure. The buffer layer 150 may be located on the anti-reflective layer 160.

Each of the green color filters $CF_G$ may include a green inorganic color filter 210 and a green organic color filter 320. The green organic color filter 320 may be located on the green inorganic color filter 210. The green organic color filter 320 may be an OCF.

A vertical thickness of the green organic color filter 320 may be less than a vertical thickness of the green inorganic color filter 210. A level of an upper surface of the green organic color filter 320 may be higher than a level of an upper surface of the red color filter $CF_R$. The level of the upper surface of the green organic color filter 320 may be higher than a level of an upper surface of the blue color filter $CF_B$.

A vertical thickness of the planarization layer 400 on the green color filter $CF_G$ may be less than a vertical thickness of the planarization layer 400 on the red color filter $CF_R$. The vertical thickness of the planarization layer 400 on the green color filter $CF_G$ may be less than a vertical thickness of the planarization layer 400 on the blue color filter $CF_B$. Side surfaces of an upper part of the green organic color filter 320 may be covered by the planarization layer 400.

Figure 4:
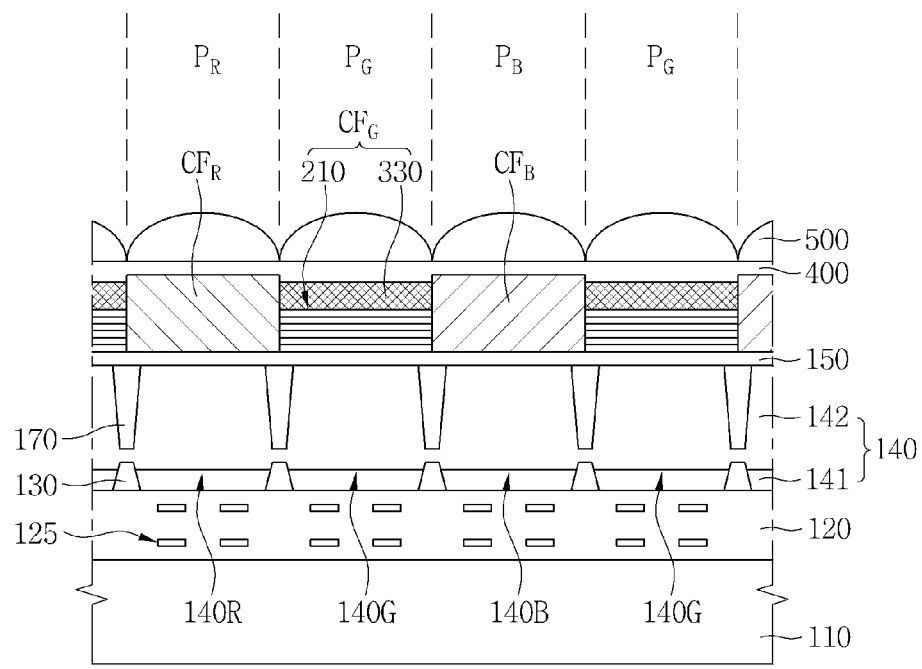

FIG. 4 is a cross-sectional view showing an electronic device in accordance with still another exemplary embodiment.

Referring to FIG. 4, the electronic device in accordance with the exemplary embodiment may include a support substrate 110, an interlayer insulating layer 120, isolation structures 130, red photoelectric conversion devices 140R, blue photoelectric conversion devices 140B, green photoelectric conversion devices 140G, a buffer layer 150, pixel isolation layers 170, red color filters $CF_R$, blue color filters $CF_B$, green color filters $CF_G$, a planarization layer 400, and micro-lenses 500.

Internal interconnections 125 may be disposed in the interlayer insulating layer 120. Each of the red photoelectric conversion devices 140R, the blue photoelectric conversion devices 140B, and the green photoelectric conversion devices 140G may include a photodiode 140. The photodiode 140 may include a first impurity area 141 and a second impurity area 142.

The support substrate 110 may include red pixel areas $P_R$, blue pixel areas $P_B$, and green pixel areas $P_G$. The pixel isolation layers 170 may be located between the red photoelectric conversion devices 140R, the blue photoelectric conversion devices 140B, and the green photoelectric conversion devices 140G. The pixel isolation layers 170 may be located on the isolation structures 130. The pixel isolation layer 170 may include an insulating material. For example, the pixel isolation layer 170 may include silicon oxide. The pixel isolation layer 170 may extend into the second impurity area 142 of the photodiode 140.

Each of the green color filters $CF_G$ may include a green inorganic color filter 210 and a green organic color filter 330. The green organic color filter 330 may be an OCF. The green organic color filter 330 may be located on the green inorganic color filter 210.

A vertical thickness of the green organic color filter 330 may be less than a vertical thickness of the green inorganic color filter 210. A level of an upper surface of the green organic color filter 330 may be lower than a level of an upper surface of the red color filter $CF_R$. The level of the upper surface of the green organic color filter 330 may be lower than a level of an upper surface of the blue color filter $CF_B$.

A vertical thickness of the planarization layer 400 on the green color filter $CF_G$ may be greater than a vertical thickness of the planarization layer 400 on the red color filter $CF_R$. The vertical thickness of the planarization layer 400 on the green color filter $CF_G$ may be greater than a vertical thickness of the planarization layer 400 on the blue color filter $CF_B$. Side surfaces of an upper part of the red color filter $CF_R$ and side surfaces of an upper part of the blue color filter $CF_B$ may be covered by the planarization layer 400.

Figure 5:
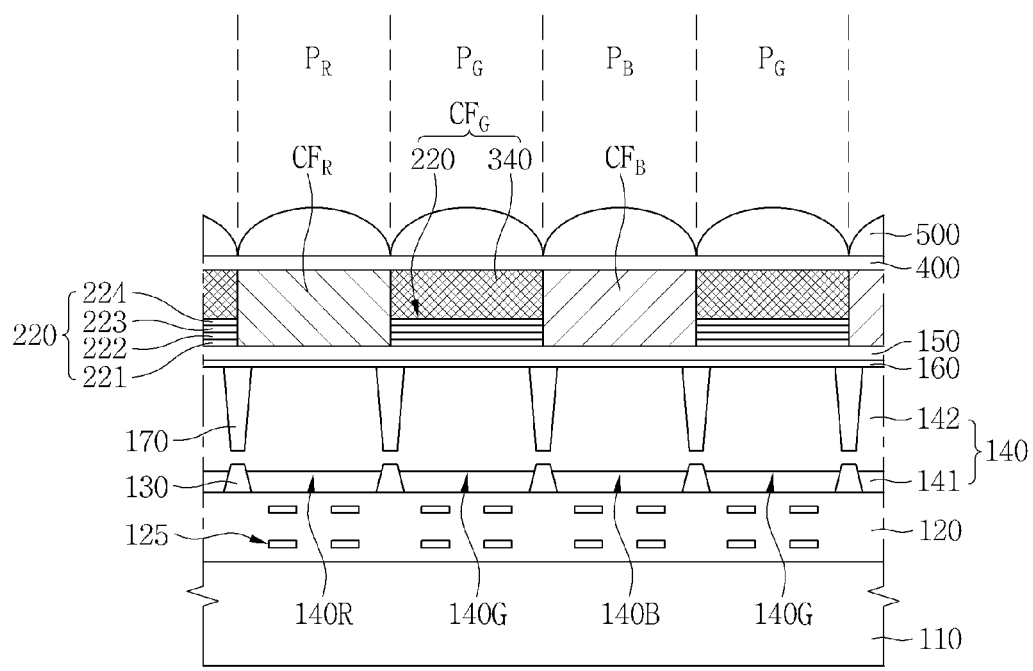

FIG. 5 is a cross-sectional view showing an electronic device in accordance with yet another exemplary embodiment.

Referring to FIG. 5, the electronic device in accordance with the exemplary embodiment may include a support substrate 110 including red pixel areas $P_R$, blue pixel areas $P_B$, and green pixel areas $P_G$, an interlayer insulating layer 120, isolation structures 130, red photoelectric conversion devices 140R, blue photoelectric conversion devices 140B, green photoelectric conversion devices 140G, a buffer layer 150, an anti-reflective layer 160, pixel isolation layers 170, red color filters $CF_R$, blue color filters $CF_B$, green color filters $CF_G$, a planarization layer 400, and micro-lenses 500.

Internal interconnections 125 may be disposed in the interlayer insulating layer 120. Each of the red photoelectric conversion devices 140R, the blue photoelectric conversion devices 140B, and the green photoelectric conversion devices 140G may include a photodiode 140. The photodiode 140 may include a first impurity area 141 and a second impurity area 142.

Each of the green color filters $CF_G$ may include a green inorganic color filter 220 and a green organic color filter 340.

The green inorganic color filter 220 may be located near the buffer layer 150. The green inorganic color filter 220 may be the ICF. For example, the green inorganic color filter 220 may include a first green inorganic color filter layer 221, a second green inorganic color filter layer 222, a third green inorganic color filter layer 223, and a fourth green inorganic color filter layer 224. Here, four layers are described; however, the number of layers is not particularly limited and may be more or less than four.

The green organic color filter 340 may be located on the green inorganic color filter 220. The green organic color filter 340 may be an OCF.

A vertical thickness of the green organic color filter 340 may be greater than a vertical thickness of the green inorganic color filter 220. A level of an upper surface of the green organic color filter 340 may be the same as a level of an upper surface of the red color filter $CF_R$. The level of the upper surface of the green organic color filter 340 may be the same as a level of an upper surface of the blue color filter $CF_B$.

Figure 6:
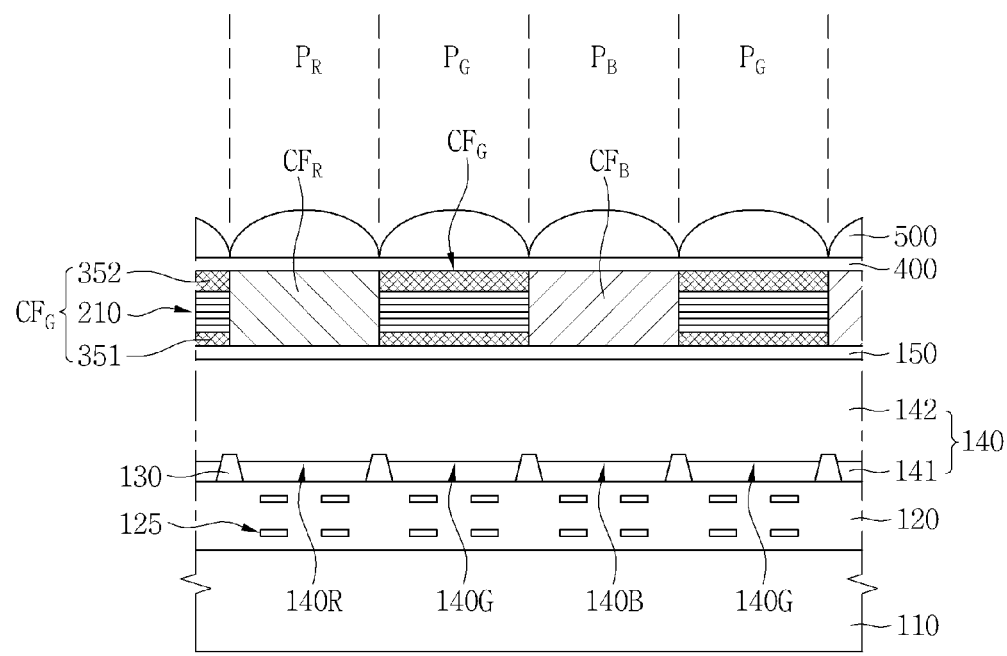

FIG. 6 is a cross-sectional view showing an electronic device in accordance with yet another exemplary embodiment.

Referring to FIG. 6, the electronic device in accordance with the exemplary embodiment may include a support substrate 110 including red pixel areas $P_R$, blue pixel areas $P_B$, and green pixel areas $P_G$, an interlayer insulating layer 120, isolation structures 130, red photoelectric conversion devices 140R, blue photoelectric conversion devices 140B, green photoelectric conversion devices 140G, a buffer layer 150, red color filters $CF_R$, the blue color filters $CF_B$, green color filters $CF_G$, planarization layer 400, and micro-lenses 500.

Internal interconnections 125 may be disposed in the interlayer insulating layer 120. Each of the red photoelectric conversion devices 140R, the blue photoelectric conversion devices 140B, and the green photoelectric conversion devices 140G may include a photodiode 140. The photodiode 140 may include a first impurity area 141 and a second impurity area 142.

Each of the green color filters $CF_G$ may include a lower green organic color filter 351, a green inorganic color filter 210, and an upper green organic color filter 352. The green inorganic color filter 210 may be located between the lower green organic color filter 351 and the upper green organic color filter 352.

The lower green organic color filter 351 may be located near the buffer layer 150. For example, the lower green organic color filter 351 may be located on the buffer layer 150. The lower green organic color filter 351 may be located between the corresponding green photoelectric conversion device 140G and the green inorganic color filter 210. The lower green organic color filter 351 may be an OCF.

An area size of the lower green organic color filter 351 may be the same as an area size of each green pixel area $P_G$.

A maximum horizontal width of the lower green organic color filter 351 may be the same as a horizontal width of each green pixel area $P_G$.

A level of a lower surface of the lower green organic color filter 351 may be the same as a level of a lower surface of the red color filter $CF_R$. The level of the lower surface of the lower green organic color filter 351 may be the same as a level of a lower surface of the blue color filter $CF_B$.

A vertical thickness of the lower green organic color filter 351 may be less than a vertical thickness of the red color filter $CF_R$. The vertical thickness of the lower green organic color filter 351 may be less than a vertical thickness of the blue color filter $CF_B$. The vertical thickness of the lower green organic color filter 351 may be less than a vertical thickness of the green inorganic color filter 210.

The upper green organic color filter 352 may be located on the green inorganic color filter 210. The upper green organic color filter 352 may be located between the green inorganic color filter 210 and the corresponding micro-lens 500. The upper green organic color filter 352 may be an OCF.

An area size of the upper green organic color filter 352 may be the same as the area size of the lower green organic color filter 351. A maximum horizontal width of the upper green organic color filter 352 may be the same as the maximum horizontal width of the lower green organic color filter 351.

A level of an upper surface of the upper green organic color filter 352 may be the same as a level of an upper surface of the red color filter $CF_R$. The level of the upper surface of the upper green organic color filter 352 may be the same as a level of an upper surface of the blue color filter $CF_B$. A vertical thickness of the upper green organic color filter 352 may be less than the vertical thickness of the green inorganic color filter 210. The vertical thickness of the upper green organic color filter 352 may be greater than the vertical thickness of the lower green organic color filter 351.

According to the electronic device in accordance with the above-described exemplary embodiment, each of the green color filters $CF_G$ may have a structure in which the lower green organic color filter 351, the green inorganic color filter 210, and the upper green organic color filter 352 are stacked. Light that passes through the green inorganic color filter 210 may be incident on the lower green organic color filter 351. Light that passes through the upper green organic color filter 352 may be incident on the green inorganic color filter 210. The vertical thickness of the lower green organic color filter 351 may be smaller than the vertical thickness of the upper green organic color filter 352. Therefore, in the electronic device in accordance with the above-described exemplary embodiment, a loss of light which is incident on the green photoelectric conversion devices 140G, a generation of a flare due to the green inorganic color filter 210, and optical crosstalk between adjacent pixel areas $P_R$, $P_B$, and $P_G$ may be reduced.

Figure 7:
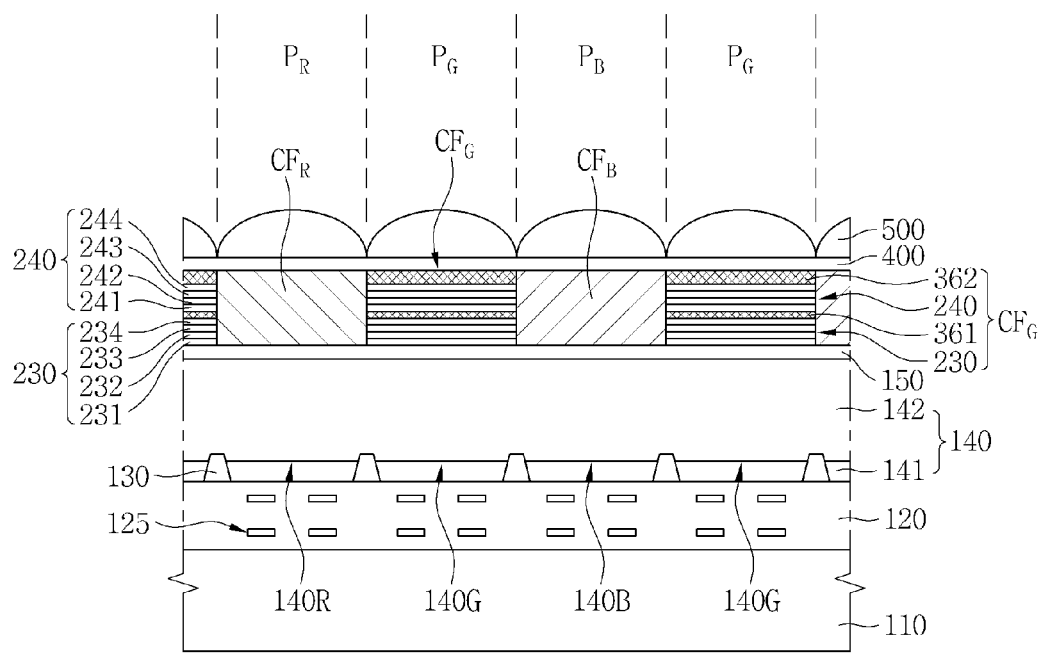

FIG. 7 is a cross-sectional view showing an electronic device in accordance with yet another exemplary embodiment.

Referring to FIG. 7, the electronic device in accordance with the exemplary embodiment may include a support substrate 110 including red pixel areas $P_R$, blue pixel areas $P_B$, and green pixel areas $P_G$, an interlayer insulating layer 120, the isolation structures 130, red photoelectric conversion devices 140R, blue photoelectric conversion devices 140B, green photoelectric conversion devices 140G, a buffer layer 150, red color filters $CF_R$, blue color filters $CF_B$, green color filters $CF_G$, a planarization layer 400, and micro-lenses 500.

Internal interconnections 125 may be disposed in the interlayer insulating layer 120. Each of the red photoelectric conversion devices 140R, the blue photoelectric conversion devices 140B, and the green photoelectric conversion devices 140G may include a photodiode 140. The photodiode 140 may include a first impurity area 141 and a second impurity area 142.

Each of the green color filters $CF_G$ may include a lower green inorganic color filter 230, an intermediate green organic color filter 361, an upper green inorganic color filter 240, and an upper green organic color filter 362.

The lower green inorganic color filter 230 may be located near the buffer layer 150. For example, the lower green inorganic color filter 230 may be located on the buffer layer 150. A level of a lower surface of the lower green inorganic color filter 230 may be the same as a level of a lower surface of the red color filter $CF_R$. The level of the lower surface of the lower green inorganic color filter 230 may be the same as a level of a lower surface of the blue color filter $CF_B$.

The lower green inorganic color filter 230 may be an ICF. For example, the lower green inorganic color filter 230 may include a first lower green inorganic color filter layer 231, a second lower green inorganic color filter layer 232, a third lower green inorganic color filter layer 233, and a fourth lower green inorganic color filter layer 234. Here, four layers are described; however, the number of layers is not particularly limited and may be more or less than four.

The intermediate green organic color filter 361 may be located on the lower green inorganic color filter 230. The intermediate green organic color filter 361 may be an OCF. A side surface of the lower green inorganic color filter 230 may be vertically aligned with a side surface of the intermediate green organic color filter 361. A vertical thickness of the intermediate green organic color filter 361 may be less than a vertical thickness of the lower green inorganic color filter 230.

The upper green inorganic color filter 240 may be located on the intermediate green organic color filter 361. The upper green inorganic color filter 240 may be an ICF. The side surface of the intermediate green organic color filter 361 may be vertically aligned with a side surface of the upper green inorganic color filter 240. The side surface of the lower green inorganic color filter 230 may be vertically aligned with the side surface of the upper green inorganic color filter 240.

A vertical thickness of the upper green inorganic color filter 240 may be greater than the vertical thickness of the intermediate green organic color filter 361. For example, the vertical thickness of the upper green inorganic color filter 240 may be the same as the vertical thickness of the lower green inorganic color filter 230. The upper green inorganic color filter 240 may include a first upper green inorganic color filter layer 241, a second upper green inorganic color filter layer 242, a third upper green inorganic color filter layer 243, and a fourth upper green inorganic color filter layer 244. Here, four layers are described; however, the number of layers is not particularly limited and may be more or less than four.

The upper green organic color filter 362 may be located on the upper green inorganic color filter 240. The upper green organic color filter 362 may be an OCF. The side surface of the upper green inorganic color filter 240 may be vertically aligned with a side surface of the upper green organic color filter 362. The side surface of the intermediate green organic color filter 361 may be vertically aligned with the side surface of the upper green organic color filter 362.

A level of an upper surface of the upper green organic color filter 362 may be the same as a level of an upper surface of the red color filter $CF_R$. The level of the upper surface of the upper green organic color filter 362 may be the same as a level of an upper surface of the blue color filter $CF_B$.

A vertical thickness of the upper green organic color filter 362 may be less than the vertical thickness of the upper green inorganic color filter 240. The vertical thickness of the upper green organic color filter 362 may be greater than the vertical thickness of the intermediate green organic color filter 361.

Figure 8:
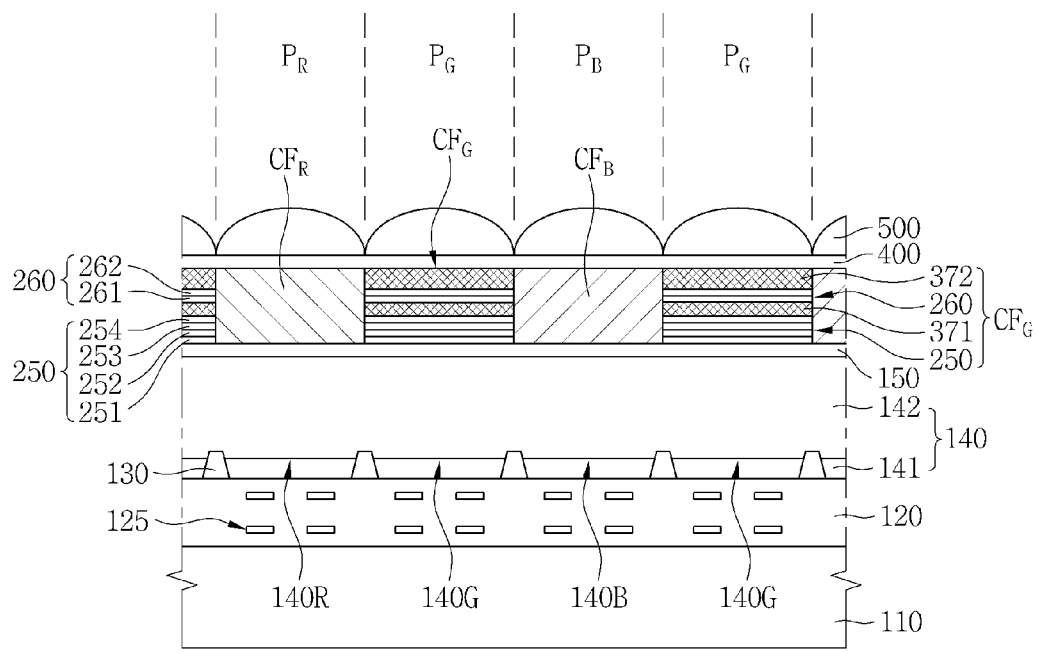

FIG. 8 is a cross-sectional view showing an electronic device in accordance with yet another exemplary embodiment.

Referring to FIG. 8, the electronic device in accordance with the exemplary embodiment may include a support substrate 110 including red pixel areas $P_R$, blue pixel areas $P_B$, and green pixel areas $P_G$, an interlayer insulating layer 120, isolation structures 130, red photoelectric conversion devices 140R, blue photoelectric conversion devices 140B, green photoelectric conversion devices 140G, a buffer layer 150, red color filters $CF_R$, blue color filters $CF_B$, green color filters $CF_G$, a planarization layer 400, and micro-lenses 500.

Internal interconnections 125 may be disposed in the interlayer insulating layer 120. Each of the red photoelectric conversion devices 140R, the blue photoelectric conversion devices 140B, and the green photoelectric conversion devices 140G may include a photodiode 140. The photodiode 140 may include a first impurity area 141 and a second impurity area 142.

Each of the green color filters $CF_G$ may include a lower green inorganic color filter 250, an intermediate green organic color filter 371, an upper green inorganic color filter 260, and an upper green organic color filter 372.

The lower green inorganic color filter 250 may be located near the buffer layer 150. For example, the lower green inorganic color filter 250 may be located on the buffer layer 150. The lower green inorganic color filter 250 may be an ICF. For example, the lower green inorganic color filter 250 may include a first lower green inorganic color filter layer 251, a second lower green inorganic color filter layer 252, a third lower green inorganic color filter layer 253, and a fourth lower green inorganic color filter layer 254. Here, four layers are described; however, the number of layers is not particularly limited and may be more or less than four.

The intermediate green organic color filter 371 may be located on the lower green inorganic color filter 250. The intermediate green organic color filter 371 may be an OCF. A vertical thickness of the intermediate green organic color filter 371 may be less than a vertical thickness of the lower green inorganic color filter 250.

The upper green inorganic color filter 260 may be located on the intermediate green organic color filter 371. The upper green inorganic color filter 260 may be an ICF. A vertical thickness of the upper green inorganic color filter 260 may be less than the vertical thickness of the lower green inorganic color filter 250. For example, the upper green inorganic color filter 260 may include a first upper green inorganic color filter layer 261 and a second upper green inorganic color filter layer 262. For example, the vertical thickness of the upper green inorganic color filter 260 may be the same as the vertical thickness of the intermediate green organic color filter 371. Here, two layers are described; however, the number of layers is not particularly limited and may be more or less than two.

The upper green organic color filter 372 may be located on the upper green inorganic color filter 260. The upper green organic color filter 372 may be an OCF. A level of an upper surface of the upper green organic color filter 372 may be the same as a level of an upper surface of the red color filter $CF_R$. The level of the upper surface of the upper green organic color filter 372 may be the same as a level of an upper surface of the blue color filter $CF_B$.

A vertical thickness of the upper green organic color filter 372 may be greater than the vertical thickness of the lower green inorganic color filter 250. The vertical thickness of the upper green organic color filter 372 may be greater than the vertical thickness of the intermediate green organic color filter 371. The vertical thickness of the upper green organic color filter 372 may be greater than the vertical thickness of the upper green inorganic color filter 260.

Figure 9:
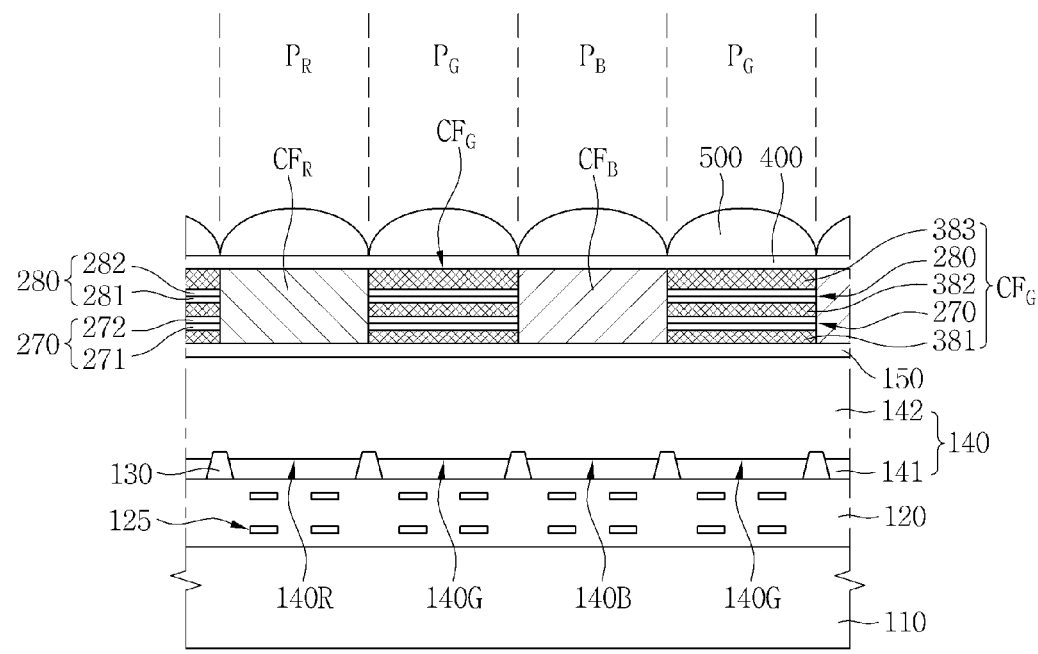

FIG. 9 is a cross-sectional view showing an electronic device in accordance with yet another exemplary embodiment.

Referring to FIG. 9, the electronic device in accordance with the exemplary embodiment may include a support substrate 110 including red pixel areas $P_R$, blue pixel areas $P_B$, and green pixel areas $P_G$, an interlayer insulating layer 120, isolation structures 130, red photoelectric conversion devices 140R, blue photoelectric conversion devices 140B, green photoelectric conversion devices 140G, a buffer layer 150, red color filters $CF_R$, blue color filters $CF_B$, green color filters $CF_G$, a planarization layer 400, and micro-lenses 500.

Internal interconnections 125 may be disposed in the interlayer insulating layer 120. Each of the red photoelectric conversion devices 140R, the blue photoelectric conversion devices 140B, and the green photoelectric conversion devices 140G may include a photodiode 140. The photodiode 140 may include a first impurity area 141 and a second impurity area 142.

Each of the green color filters $CF_G$ may include a lower green organic color filter 381, a lower green inorganic color filter 270, an intermediate green organic color filter 382, an upper green inorganic color filter 280, and an upper green organic color filter 383.

The lower green organic color filter 381 may be located near the buffer layer 150. For example, the lower green organic color filter 381 may be located on the buffer layer 150. The lower green organic color filter 381 may be an OCF.

The lower green inorganic color filter 270 may be located on the lower green organic color filter 381. A side surface of the lower green organic color filter 381 may be vertically aligned with a side surface of the lower green inorganic color filter 270.

The lower green inorganic color filter 270 may be an ICF. For example, the lower green inorganic color filter 270 may include a first lower green inorganic color filter layer 271 and a second lower green inorganic color filter layer 272. For example, a vertical thickness of the lower green inorganic color filter 270 may be the same as a vertical thickness of the lower green organic color filter 381. Here, two layers are described; however, the number of layers is not particularly limited and may be more or less than two.

The intermediate green organic color filter 382 may be located on the lower green inorganic color filter 270. The side surface of the lower green inorganic color filter 270 may be vertically aligned with a side surface of the intermediate green organic color filter 382.

The intermediate green organic color filter 382 may be an OCF. A vertical thickness of the intermediate green organic color filter 382 may be the same as the vertical thickness of the lower green organic color filter 381. For example, the vertical thickness of the intermediate green organic color filter 382 may be the same as the vertical thickness of the lower green inorganic color filter 270.

The upper green inorganic color filter 280 may be located on the intermediate green organic color filter 382. The side surface of the intermediate green organic color filter 382 may be vertically aligned with a side surface of the upper green inorganic color filter 280.

The upper green inorganic color filter 280 may be an ICF. For example, the upper green inorganic color filter 280 may include a first upper green inorganic color filter layer 281 and a second upper green inorganic color filter layer 282. For example, a vertical thickness of the upper green inorganic color filter 280 may be the same as the vertical thickness of the lower green inorganic color filter 270. Here, two layers are described; however, the number of layers is not particularly limited and may be more or less than two.

The upper green organic color filter 383 may be located on the upper green inorganic color filter 280. The side surface of the upper green inorganic color filter 280 may be vertically aligned with a side surface of the upper green organic color filter 383.

The upper green organic color filter 383 may be an OCF. For example, a vertical thickness of the upper green organic color filter 383 may be greater than the vertical thickness of the intermediate green organic color filter 382. For example, the vertical thickness of the upper green organic color filter 383 may be greater than the vertical thickness of the upper green inorganic color filter 280.

Figure 10:
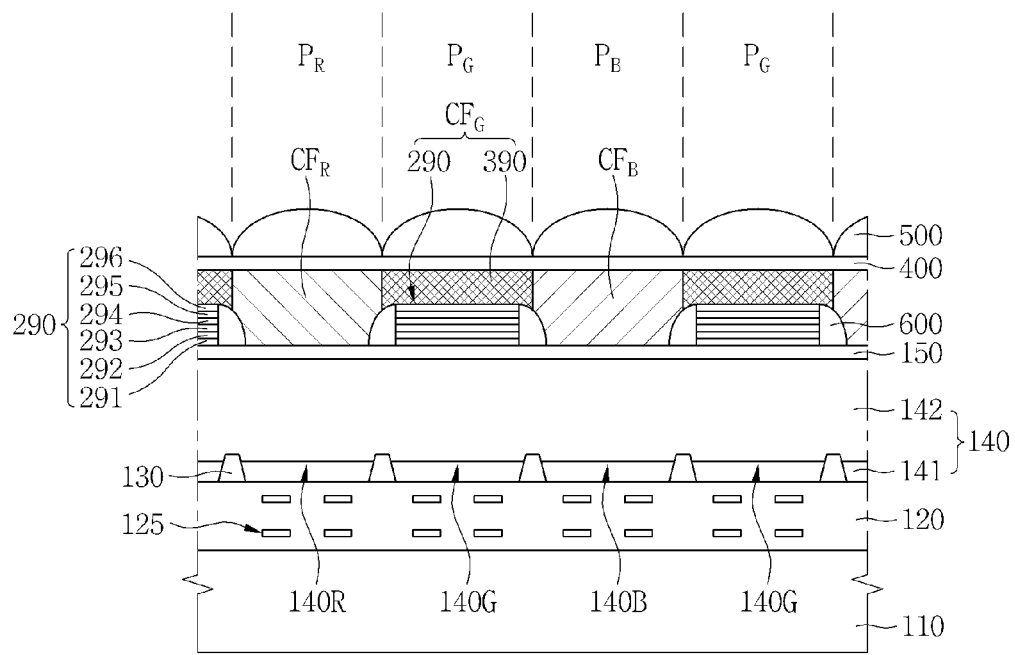

FIG. 10 is a cross-sectional view showing an electronic device in accordance with yet another exemplary embodiment.

Referring to FIG. 10, the electronic device in accordance with the exemplary embodiment may include a support substrate 110 including red pixel areas $P_R$, blue pixel areas $P_B$, and green pixel areas $P_G$, an interlayer insulating layer 120, isolation structures 130, red photoelectric conversion devices 140R, blue photoelectric conversion devices 140B, green photoelectric conversion devices 140G, a buffer layer 150, red color filters $CF_R$, blue color filters $CF_B$, green color filters $CF_G$, a planarization layer 400, micro-lenses 500, and metal patterns 600.

Internal interconnections 125 may be disposed in the interlayer insulating layer 120. Each of the red photoelectric conversion devices 140R, the blue photoelectric conversion devices 140B, and the green photoelectric conversion devices 140G may include a photodiode 140. The photodiode 140 may include a first impurity area 141 and a second impurity area 142.

Each of the green color filters $CF_G$ may include a green inorganic color filter 290 and a green organic color filter 390. The green inorganic color filter 290 may be an ICF. The green organic color filter 390 may be located on the green inorganic color filter 290. The green organic color filter 390 may be an OCF.

The metal patterns 600 may be located between the red pixel areas $P_R$, the blue pixel areas $P_B$, and the green pixel areas $P_G$. The metal pattern 600 may be located between the green inorganic color filter 290 and the red color filter $CF_R$. The metal pattern 600 may be located between the green inorganic color filter 290 and the blue color filter $CF_B$. For example, the metal pattern 600 may be provided on side horizontal side of the green inorganic color filter 290. An A vertical thickness of each metal pattern 600 may be more reduced farther away from the green inorganic color filter 290. For example, a cross-section of each metal pattern 600 may be a spacer shape. A maximum vertical thickness of the metal pattern 600 may be the same as a vertical thickness of the green inorganic color filter 290.

The metal pattern 600 may include a metal. For example, the metal pattern 600 may include aluminum (Al), chromium (Cr), molybdenum (Mo), titanium (Ti), or tungsten (W).

An area size of the green inorganic color filter 290 may be smaller than an area size of each green pixel area $P_G$. A horizontal width of a lower surface of the green inorganic color filter 290 may be smaller than a horizontal width of the green pixel area $P_G$.

A maximum horizontal width of the green organic color filter 390 may be greater than a maximum horizontal width of the green inorganic color filter 290. The green organic color filter 390 may extend over and on the metal pattern 600. A horizontal width of an upper surface of the green organic color filter 390 may be greater than the horizontal width of the lower surface of the green inorganic color filter 290.

A lower part of the red color filter $CF_R$ may be located between the metal patterns 600. An upper part of the red color filter $CF_R$ may extend over and on at least a portion of the metal pattern 600. A maximum horizontal width of an upper surface of the red color filter $CF_R$ may be greater than a maximum horizontal width of a lower surface of the red color filter $CF_R$.

The maximum horizontal width of the lower surface of the red color filter $CF_R$ may be the same as a maximum horizontal width of the lower surface of the green inorganic color filter 290. The maximum horizontal width of an upper surface of the red color filter $CF_R$ may be the same as a maximum horizontal width of the upper surface of the green organic color filter 390. A side surface of the red color filter $CF_R$ may directly contact a side surface of the green organic color filter 390 over and on the metal pattern 600.

A lower part of the blue color filters $CF_B$ may be located between the metal patterns 600. An upper part of the blue color filters $CF_B$ may extend over and on at least a portion of the metal pattern 600. A maximum horizontal width of an upper surface of the blue color filter $CF_B$ may be greater than a maximum horizontal width of a lower surface of the blue color filter $CF_B$.

The maximum horizontal width of the lower surface of the blue color filters $CF_B$ may be the same as the maximum horizontal width of the lower surface of the red color filter $CF_R$. The maximum horizontal width of the lower surface of the blue color filter $CF_B$ may be the same as the maximum horizontal width of the lower surface of the green inorganic color filter 290. The maximum horizontal width of the upper surface of the blue color filter $CF_B$ may be the same as the maximum horizontal width of the upper surface of the red color filter $CF_R$. The maximum horizontal width of the upper surface of the blue color filter $CF_B$ may be the same as the maximum horizontal width of the upper surface of the green organic color filter 390. A side surface of the blue color filter $CF_B$ may directly contact the side surface of the green organic color filter 390 over and on the metal pattern 600.

Figure 11:
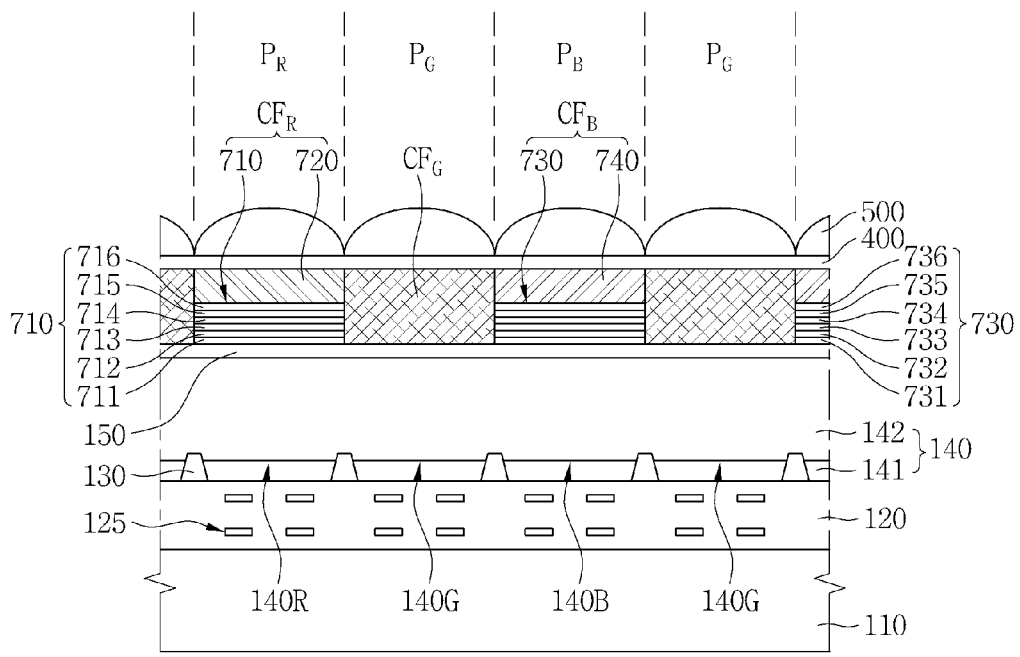

FIG. 11 is a cross-sectional view showing an electronic device in accordance with yet another exemplary embodiment.

Referring to FIG. 11, the electronic device in accordance with the exemplary embodiment may include a support substrate 110 including red pixel areas $P_R$, blue pixel areas $P_B$, and green pixel areas $P_G$, an interlayer insulating layer 120, isolation structures 130, red photoelectric conversion devices 140R, blue photoelectric conversion devices 140B, green photoelectric conversion devices 140G, a buffer layer 150, red color filters $CF_R$, blue color filters $CF_B$, green color filters $CF_G$, a planarization layer 400, and micro-lenses 500.

Internal interconnections 125 may be disposed in the interlayer insulating layer 120. Each of the red photoelectric conversion devices 140R, the blue photoelectric conversion devices 140B, and the green photoelectric conversion devices 140G may include a photodiode 140. The photodiode 140 may include a first impurity area 141 and a second impurity area 142.

Each of the red color filters $CF_R$ may include a red inorganic color filter 710 and a red organic color filter 720. The red organic color filter 720 may be located on the red inorganic color filter 710.

The red inorganic color filter 710 may be an ICF. For example, the red inorganic color filter 710 may include a first red inorganic color filter layer 711, a second red inorganic color filter layer 712, a third red inorganic color filter layer 713, a fourth red inorganic color filter layer 714, a fifth red inorganic color filter layer 715, and a sixth red inorganic color filter layer 716. Here, six layers are described; however, the number of layers is not particularly limited and may be more or less than six.

The red organic color filter 720 may be an OCF. A vertical thickness of the red organic color filter 720 may be less than a vertical thickness of the red inorganic color filter 710.

Each of the blue color filters $CF_B$ may include a blue inorganic color filter 730 and a blue organic color filter 740. The blue organic color filter 740 may be located on the blue inorganic color filter 730.

The blue inorganic color filter 730 may be an ICF. A vertical thickness of the blue inorganic color filter 730 may be the same as the vertical thickness of the red inorganic color filter 710. For example, the blue inorganic color filter 730 may include a first blue inorganic color filter layer 731, a second blue inorganic color filter layer 732, a third blue inorganic color filter layer 733, a fourth blue inorganic color filter layer 734, a fifth blue inorganic color filter layer 735, and a sixth blue inorganic color filter layer 736. Here, six layers are described; however, the number of layers is not particularly limited and may be more or less than six.

The blue organic color filter 740 may be an OCF. A vertical thickness of the blue organic color filter 740 may be less than the vertical thickness of the blue inorganic color filter 730. For example, the vertical thickness of the blue organic color filter 740 may be the same as the vertical thickness of the red organic color filter 720.

The green color filter $CF_G$ may be an OCF. A level of a lower surface of the green color filter $CF_G$ may be the same as a level of a lower surface of the red inorganic color filter 710 and a level of a lower surface of the blue inorganic color filter 730. A level of an upper surface of the green color filter $CF_G$ may be the same as a level of an upper surface of the red organic color filter 720 and a level of an upper surface of the blue organic color filter 740.

According to the electronic device in accordance with the above-described exemplary embodiment, each of the red color filters $CF_R$ and the blue color filters $CF_B$ may have a structure in which the ICF and the OCF are stacked. However, in the electronic device in accordance with the above-described exemplary embodiment, light that passes through the color filters $CF_R$, $CF_B$, and $CF_G$, having a structure in which the ICF and the OCF are stacked, may have different wavelength ranges. In the electronic device in accordance with the above-described exemplary embodiment, the pixel areas $P_R$, $P_B$, and $P_G$ of the color filters $CF_R$, $CF_B$, and $CF_G$ formed by the OCF may be disposed in a zigzag shape.

Figure 12:
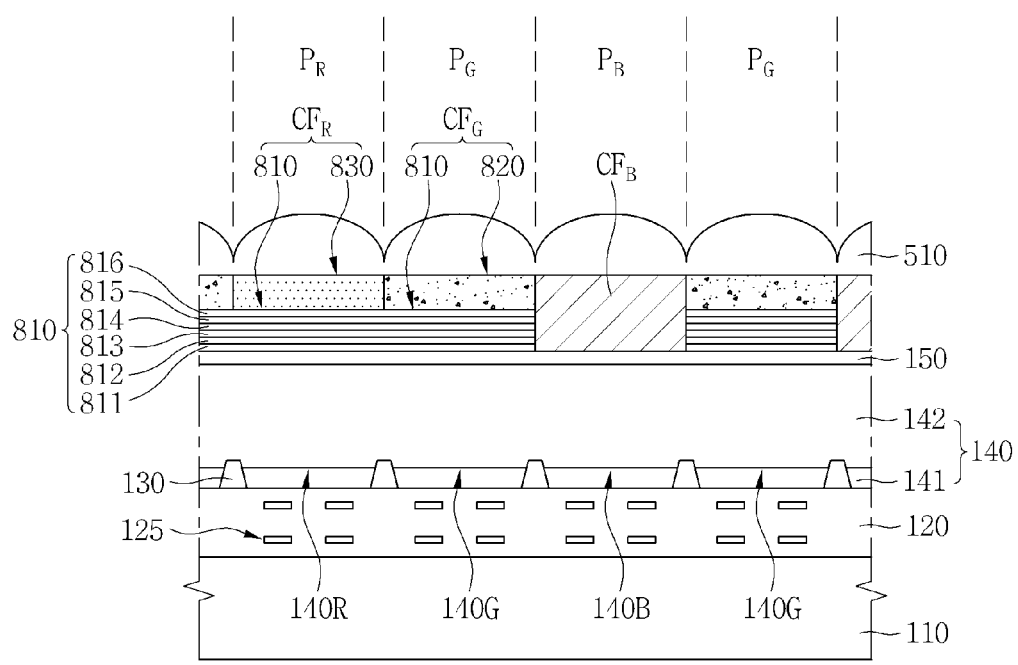

FIG. 12 is a cross-sectional view showing an electronic device in accordance with yet another exemplary embodiment.

Referring to FIG. 12, the electronic device in accordance with the exemplary embodiment may include a support substrate 110 including red pixel areas $P_R$, blue pixel areas $P_B$, and green pixel areas $P_G$, and interlayer insulating layer 120, isolation structures 130, red photoelectric conversion devices 140R, blue photoelectric conversion devices 140B, green photoelectric conversion devices 140G, a buffer layer 150, red color filters $CF_R$, blue color filters $CF_B$, green color filters $CF_G$, and micro-lenses 510.

Internal interconnections 125 may be disposed in the interlayer insulating layer 120. Each of the red photoelectric conversion devices 140R, the blue photoelectric conversion devices 140B, and the green photoelectric conversion devices 140G may include a photodiode 140. The photodiode 140 may include a first impurity area 141 and a second impurity area 142.

Each of the green color filters $CF_G$ may include a shared inorganic color filter 810 and a green organic color filter 820. The shared inorganic color filter 810 may be an ICF. For example, the shared inorganic color filter 810 may include a first shared inorganic color filter layer 811, a second shared inorganic color filter layer 812, a third shared inorganic color filter layer 813, a fourth shared inorganic color filter layer 814, a fifth shared inorganic color filter layer 815, and a sixth shared inorganic color filter layer 816. The green organic color filter 820 may be located on a portion of the shared inorganic color filter 810. The green organic color filter 820 may be an OCF. Here, six layers are described; however, the number of layers is not particularly limited and may be more or less than six.

Each of the red color filters $CF_R$ may include the shared inorganic color filter 810 and a red organic color filter 830. The red organic color filter 830 may be located on a portion of the shared inorganic color filter 810. The red organic color filter 830 may be an OCF.

A vertical thickness of the red organic color filter 830 may be the same as a vertical thickness of the green organic color filter 820. A level of an upper surface of the red organic color filter 830 may be the same as a level of an upper surface of the green organic color filter 820.

The blue color filter $CF_B$ may be an OCF. A level of a lower surface of the blue color filter $CF_B$ may be the same as a level of a lower surface of the share inorganic color filter 810. A level of an upper surface of the blue color filter $CF_B$ may be the same as the level of the upper surface of the green organic color filter 820 and the level of the upper surface of the red organic color filter 830.

According to the electronic device in accordance with the above-described exemplary embodiment, the red color filter $CF_R$ and the green color filter $CF_G$ may have a structure in which the ICF and the OCF are stacked, and share the ICF. However, in the electronic device in accordance with the above-described exemplary embodiment, adjacent pixel areas $P_R$, $P_B$, and $P_G$ may have a structure in which the ICF and the OCF are stacked, and share the ICF.

The micro-lenses 510 may be located on the red color filters $CF_R$, the blue color filters $CF_B$, and the green color filters $CF_G$. Each of an upper part of the red color filter $CF_R$, an upper part of the blue color filter $CF_B$, and an upper part of the green color filter $CF_G$ may be covered by the corresponding micro-lens 510.

Figure 14:
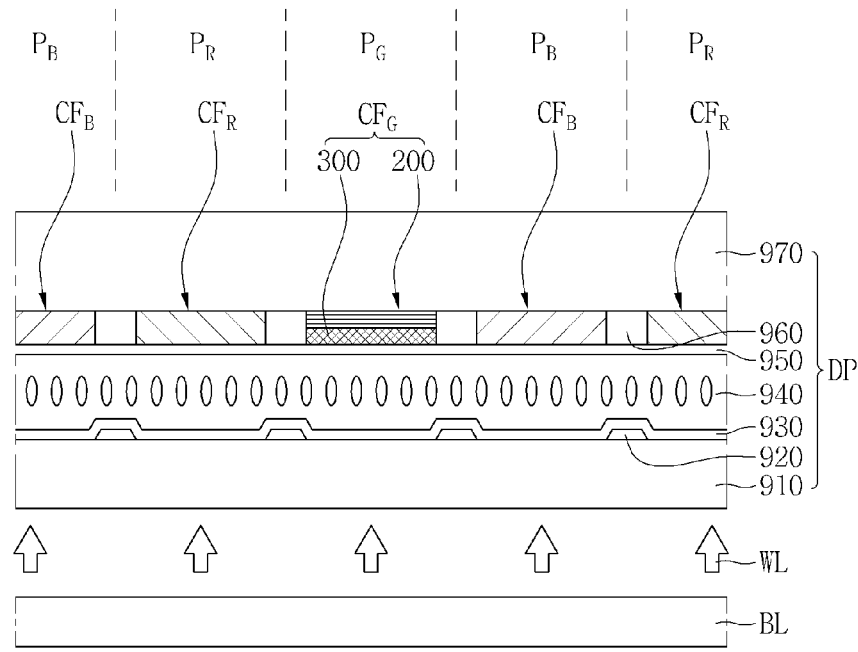
FIG. 14 is a cross-sectional view showing the electronic device taken along line II-II' of FIG. 13.

FIG. 13 is a view showing an arrangement of pixel areas in an electronic device in accordance with another exemplary embodiment, and FIG. 14 is a cross-sectional view showing the electronic device taken along line II-IF of FIG. 13.

Referring to FIGS. 13 and 14, the electronic device in accordance with the exemplary embodiment may include a backlight BL and a display panel DP. The display panel DP may include a lower substrate 910, driving devices 920, a first polarizing plate 930, a liquid crystal layer 940, a second polarizing plate 950, red color filters $CF_R$, green color filters $CF_G$, blue color filters $CF_B$, black matrices 960, and an upper substrate 970. For example, the electronic device in accordance with the exemplary embodiment may be a liquid crystal display device.

The backlight BL may supply light to the display panel DP. For example, the backlight BL may illuminate white light WL in a direction of the lower substrate 910 of the display panel DP. The backlight BL may be located on the lower substrate 910 of the display panel DP.

The display panel DP may include red pixel areas $P_R$, blue pixel areas $P_B$, and green pixel areas $P_G$. For example, the lower substrate 910 and the upper substrate 970 may include red pixel areas $P_R$, blue pixel areas $P_B$, and green pixel areas $P_G$. The green pixel area $P_G$ may be located between the red pixel area $P_R$ and the blue pixel area $P_B$. For example, in the electronic device in accordance with the above-described exemplary embodiment, the red pixel areas $P_R$, the green pixel areas $P_G$, and the blue pixel areas $P_B$ may be sequentially and repeatedly disposed, as shown in FIG. 13. For example, as shown in FIG. 13, each horizontal line of pixels may have sequentially repeating pixel areas $P_R$, $P_G$, $P_B$, $P_R$, $P_G$, $P_B$, . . . .

According to the electronic device in accordance with the above-described exemplary embodiment, the red pixel areas $P_R$, the green pixel areas $P_G$, and the blue pixel areas $P_B$ may be sequentially and repeatedly disposed in each row. However, in the electronic device in accordance with the above-described exemplary embodiment, the red pixel areas $P_R$, the green pixel areas $P_G$, and the blue pixel areas $P_B$ may alternatively be disposed as described in FIG. 1.

The lower substrate 910 and the upper substrate 970 may be disposed along a progress direction of light supplied by the backlight BL by an interval. The interval may be predetermined. The lower substrate 910 and the upper substrate 970 may be a transparent substrate. For example, the lower substrate 910 and the upper substrate 970 may be a glass substrate.

The driving devices 920 may be located on the lower substrate 910. The driving device 920 may be located between the red pixel areas $P_R$, the green pixel areas $P_G$, and the blue pixel areas $P_B$. For example, the driving device 920 may include a transistor.

The first polarizing plate 930 may be located on the driving devices 920. The first polarizing plate 930 may polarize light that is incident through the lower substrate 910 in a constant direction. The second polarizing plate 950 may be disposed on a surface of the upper substrate 970 facing the lower substrate 910. The liquid crystal layer 940 may be located between the first polarizing plate 930 and the second polarizing plate 950. The second polarizing plate 950 may polarize light that passes through the liquid crystal layer 940 in a constant direction. A polarization direction of the second polarizing plate 950 may be different from a polarization direction of the first polarizing plate 930.

The liquid crystal layer 940 may include liquid crystals located on the pixel areas $P_R$, $P_B$, and $P_G$. An arrangement of the liquid crystals located on the pixel areas $P_R$, $P_B$, and $P_G$ may be adjusted by a signal of the corresponding driving device 920. Transmissivity of the pixel areas $P_R$, $P_B$, and $P_G$ each may be changed according to the arrangement of the corresponding liquid crystals.

The red color filters $CF_R$ may be located on the red pixel areas $P_R$. The red color filter $CF_R$ may be an OCF. The blue color filters $CF_B$ may be located on the blue pixel areas $P_B$. The blue color filter $CF_B$ may be an OCF. The green color filters $CF_G$ may be located on the green pixel areas $P_G$. Each green color filter $CF_G$ may include a green inorganic color filter 200 and a green organic color filter 300.

The green inorganic color filter 200 may be an ICF. The green inorganic color filter 200 may be located near the upper substrate 970. For example, the green inorganic color filter 200 may be located on a surface of the upper substrate 970. The green organic color filter 300 may be an OCF. The green organic color filter 300 may be located near the liquid crystal layer 940.

The electronic device in accordance with the above-described exemplary embodiment may include the green organic color filter 300, in which the green color filter $CF_G$ is located near the liquid crystal layer 940, and the green inorganic color filter 200 located between the green organic color filter 300 and the upper substrate 970. The light supplied by the backlight BL passes through the liquid crystal layer 940 and is incident on the green color filter $CF_G$. That is, in the electronic device in accordance with the above-described exemplary embodiment, the light that passes through the liquid crystal layer 940 may be incident on the green organic color filter 300. Therefore, in the electronic device in accordance with the above-described exemplary embodiment, a loss of light due to the green color filter $CF_G$, a generation of a flare due to the green inorganic color filter 200, and optical crosstalk between adjacent pixel areas $P_R$, $P_B$, and $P_G$ may be reduced.

According to the electronic device in accordance with the above-described exemplary embodiment, each green color filter $CF_G$ may have a structure in which the ICF and the OCF are stacked. However, in other exemplary embodiments, alternatively, the red color filter $CF_R$ or the blue color filter $CF_B$ may have a structure in which the ICF and the OCF are stacked. Further, in still other exemplary embodiments, alternatively, at least two types of the color filters $CF_R$, $CF_B$, and $CF_G$ of the red color filters $CF_R$, the blue color filters $CF_B$, and the green color filters $CF_G$ may have a structure in which the ICF and the OCF are stacked.

FIGS. 15A to 15H are cross-sectional views sequentially showing a method of forming an electronic device in accordance with an exemplary embodiment.

The method of forming the electronic device in accordance with the exemplary embodiment will be described with reference to FIGS. 2, and 15A to 15H. First, referring to FIG. 15A, the method of forming the electronic device in accordance with the exemplary embodiment may include a process of preparing a support substrate 110 including red pixel areas $P_R$, blue pixel areas $P_B$, and green pixel areas $P_G$, a process of forming a interlayer insulating layer 120, isolation structures 130, red photoelectric conversion devices 140R, blue photoelectric conversion devices 140B, green photoelectric conversion devices 140G, and a buffer layer 150 on the support substrate 110, a process of forming a preliminary green inorganic filter layer 210a on the buffer layer 150, and a process of forming a green mask pattern 10 on the preliminary green inorganic filter layer 210a.

The process of forming the preliminary green inorganic filter layer 210a may include a process of forming a first preliminary green inorganic filter layer 211a, a process of forming a second preliminary green inorganic filter layer 212a on the first preliminary green inorganic filter layer 211a, a process of forming a third preliminary green inorganic filter layer 213a on the second preliminary green inorganic filter layer 212a, a process of forming a fourth preliminary green inorganic filter layer 214a on the third preliminary green inorganic filter layer 213a, a process of forming a fifth preliminary green inorganic filter layer 215a on the fourth preliminary green inorganic filter layer 214a, and a process of forming a sixth preliminary green inorganic filter layer 216a on the fifth preliminary green inorganic filter layer 215a. Here, the process of forming six layers is described; however, the number of layers is not particularly limited and may be more or less than six.

The green mask pattern 10 may be formed on the green pixel area $P_G$ of the support substrate 110. An area size of the green mask pattern 10 may be the same as an area size of the green pixel area $P_G$. The green pixel area $P_G$ may be completely covered by the green mask pattern 10.

Figure 15A:
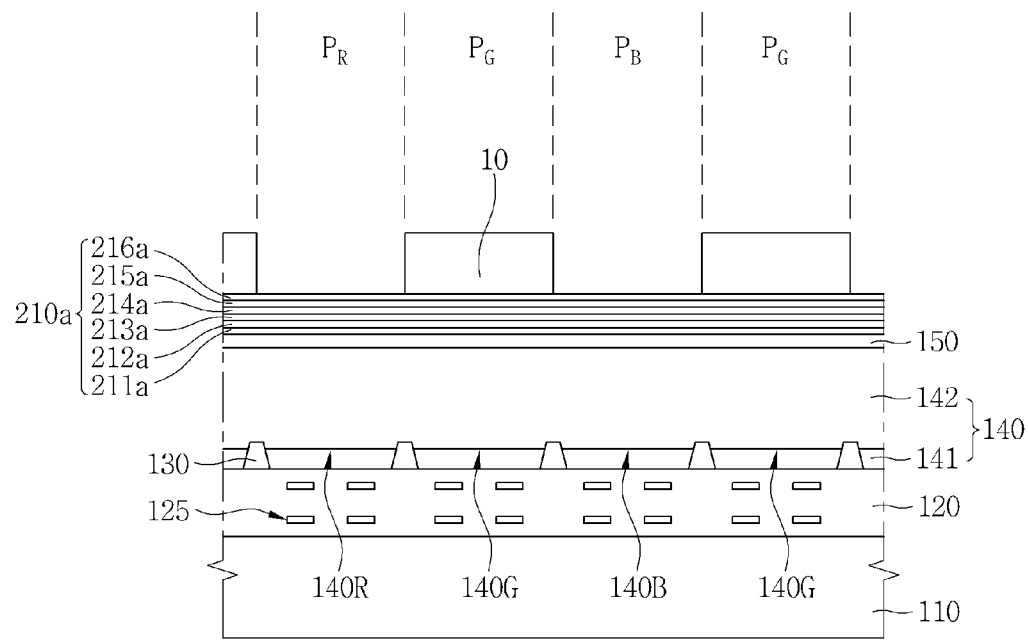
FIGS. 15A to 15H, 16A to 16E, 17A to 17E, 18A to 18E, and 19A to 19G are cross-sectional views sequentially showing methods of forming electronic devices in accordance with exemplary embodiments.
Figure 15B:
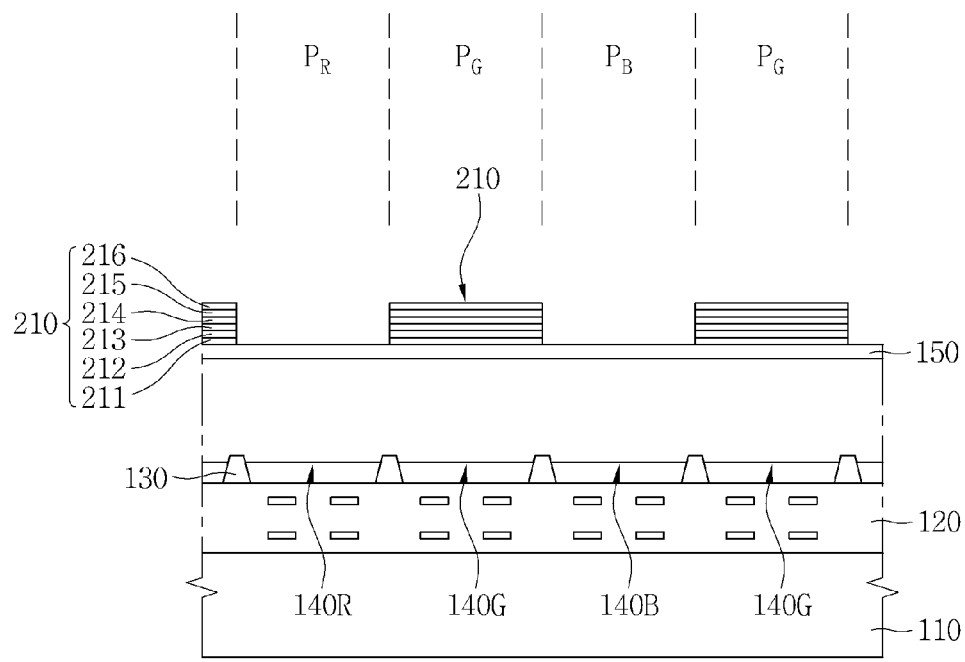

Referring to FIG. 15B, the method of forming the electronic device in accordance with the exemplary embodiment may include a process of forming green inorganic color filters 210 on the green pixel areas $P_G$.

The process of forming the green inorganic color filters 210 may include a process of etching the preliminary green inorganic filter layer 210a using the green mask pattern 10 and a process of removing the green mask pattern 10.

Each of the green inorganic color filters 210 may include a first green inorganic color filter layer 211, a second green inorganic color filter layer 212, a third green inorganic color filter layer 213, a fourth green inorganic color filter layer 214, a fifth green inorganic color filter layer 215, and a sixth green inorganic color filter layer 216. Here, six layers are described; however, the number of layers is not particularly limited and may be more or less than six.

Figure 15C:
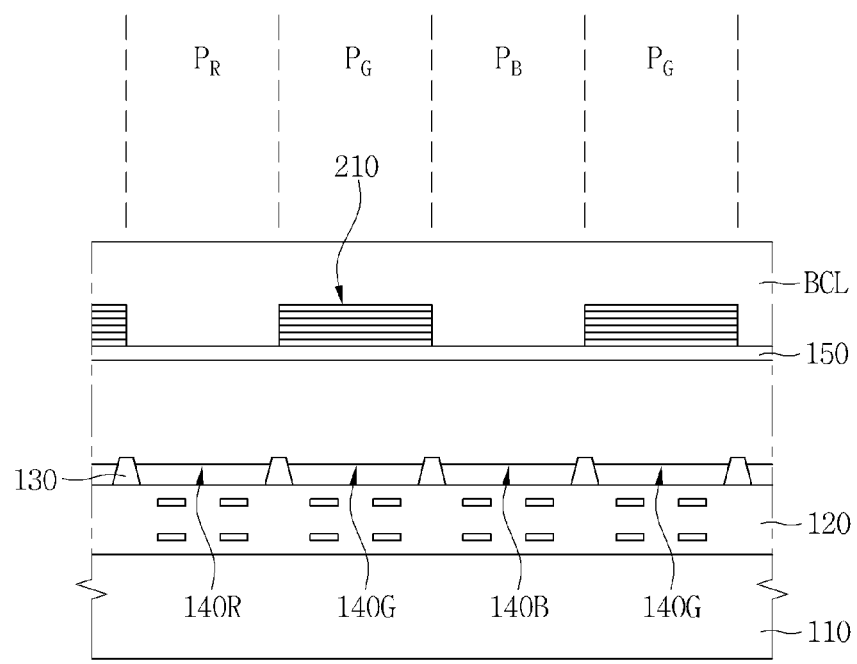

Referring to FIG. 15C, the method of forming the electronic device in accordance with the exemplary embodiment may include a process of forming a blue organic filter layer BCL on the green inorganic color filters 210.

The process of forming the blue organic filter layer BCL may include a process of depositing a photoresist or a resin having a pigment that absorbs light that presents colors except a blue color, on the green inorganic color filters 210.

Figure 15D:
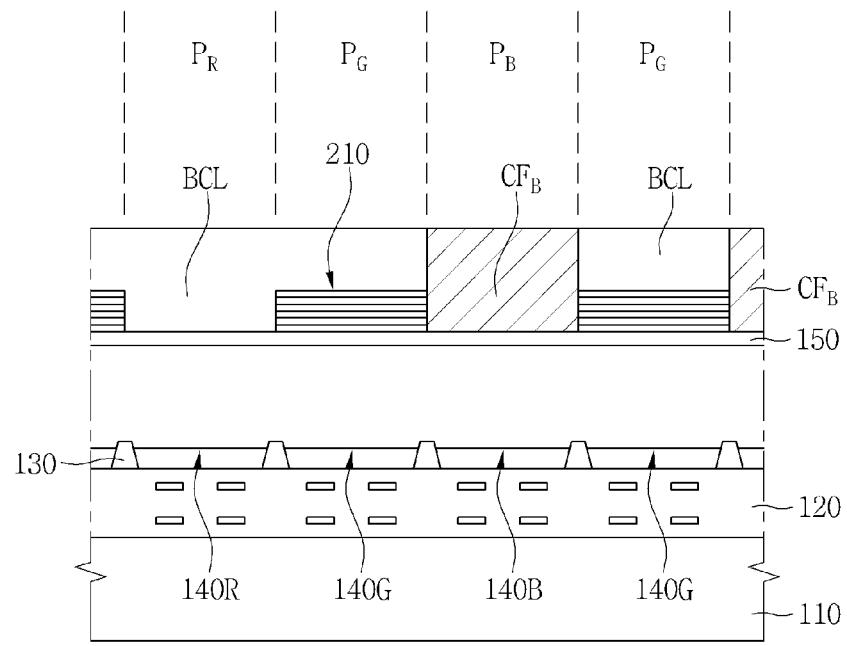

Referring to FIG. 15D, the method of forming the electronic device in accordance with the exemplary embodiment may include a process of forming blue color filters $CF_B$ on the blue pixel areas $P_B$.

The process of forming the blue color filters $CF_B$ may include exposing the blue organic filter layer BCL located on the blue pixel areas $P_B$.

Figure 15E:
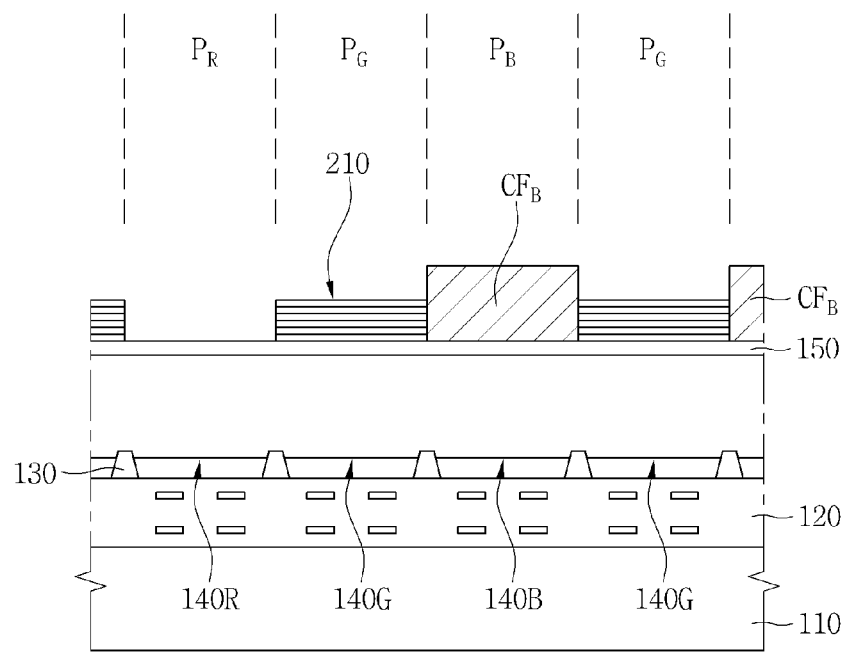

Referring to FIG. 15E, the method of forming the electronic device in accordance with the exemplary embodiment may include a process of removing the unexposed blue organic filter layer BCL.

Figure 15F:
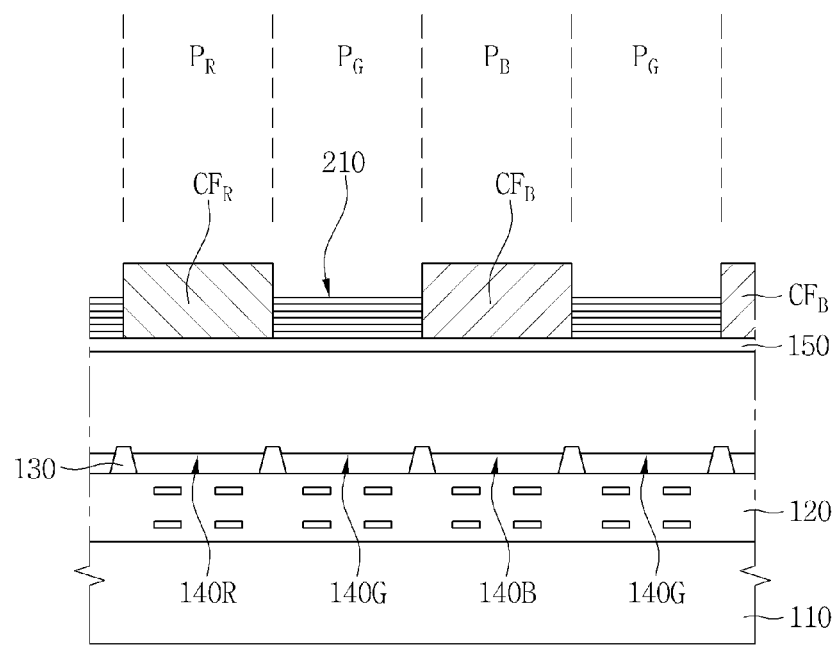

Referring to FIG. 15F, the method of forming the electronic device in accordance with the exemplary embodiment may include a process of forming red color filters $CF_R$ on the red pixel areas $P_R$.

The process of forming the red color filters $CF_R$ may include a process of forming a red organic filter layer, a process of exposing the red organic filter layer located on the red pixel areas $P_R$, and a process of removing the unexposed red organic filter layer, similar to the blue organic filter layer process discussed above.

The process of forming the red organic filter layer may include a process of depositing a photoresist or a resin having a pigment that absorbs light that presents colors except a blue color, on the green inorganic color filters 210 and the blue color filters $CF_B$.

Figure 15G:
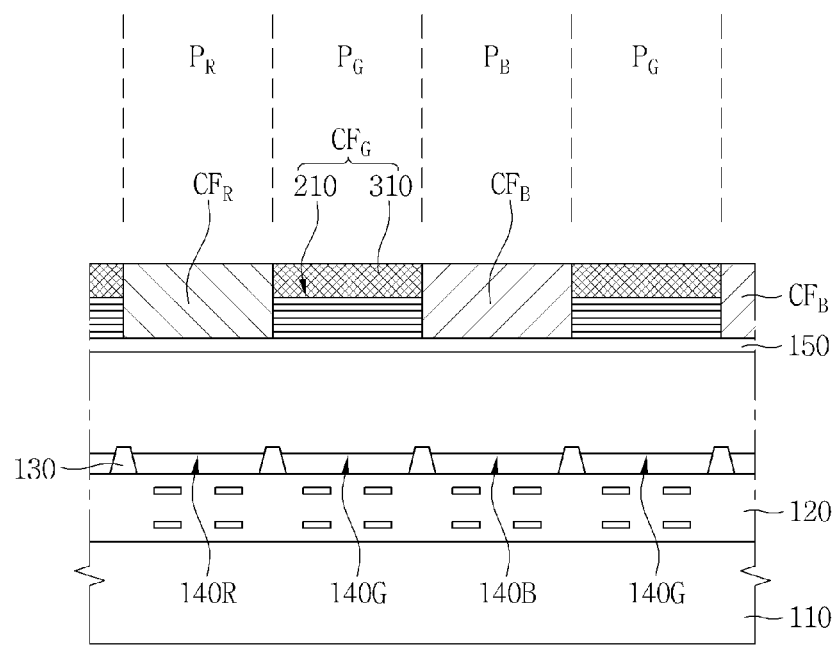

Referring to FIG. 15G, the method of forming the electronic device in accordance with the exemplary embodiment may include a process of forming green color filters $CF_G$ on the green pixel areas $P_G$.

The process of forming the green color filters $CF_G$ may include a process of forming green organic color filters 310 on the green inorganic color filters 210.

The process of forming the green organic color filters 310 may include a process of forming a green organic filter layer, a process of exposing the green organic filter layer located on the green pixel areas $P_G$, and a process of removing the unexposed green organic filter layer.

The process of forming the green organic filter layer may include a process of depositing a photoresist or a resin having a pigment that absorbs light that presents colors except a green color, on the green inorganic color filters 210, the red color filters $CF_R$ and the blue color filters $CF_B$.

Figure 15H:
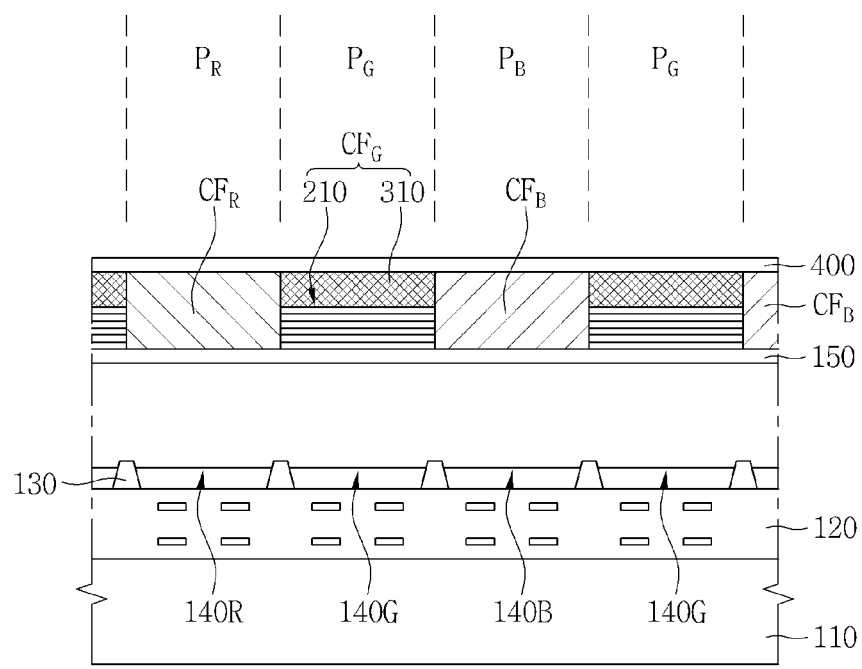

Referring to FIG. 15H, the method of forming the electronic device in accordance with the exemplary embodiment may include a process of forming a planarization layer 400 on the red color filters $CF_R$, the blue color filters $CF_B$, and the green color filters $CF_G$.

Referring to FIG. 2, the method of forming the electronic device in accordance with the exemplary embodiment may include a process of forming the micro-lenses 500 on the planarization layer 400.

FIGS. 16A to 16E are cross-sectional views sequentially showing a method of forming an electronic device in accordance with another exemplary embodiment.

The method of forming the electronic device in accordance with the exemplary embodiment will be described with reference to FIGS. 6, and 16A to 16E. First, referring to FIG. 16A, the method of forming the electronic device in accordance with the exemplary embodiment may include preparing a support substrate 110 on which an interlayer insulating layer 120, isolation structures 130, red photoelectric conversion devices 140R, blue photoelectric conversion devices 140B, green photoelectric conversion devices 140G, and a buffer layer 150 are formed, and forming a preliminary lower green organic filter layer 351a on the buffer layer 150 of the support substrate 110.

The forming of the preliminary lower green organic filter layer 351a may include depositing a photoresist or a resin, in which a pigment that absorbs light that presents colors except a green color is spread, on the buffer layer 150.

Figure 16A:
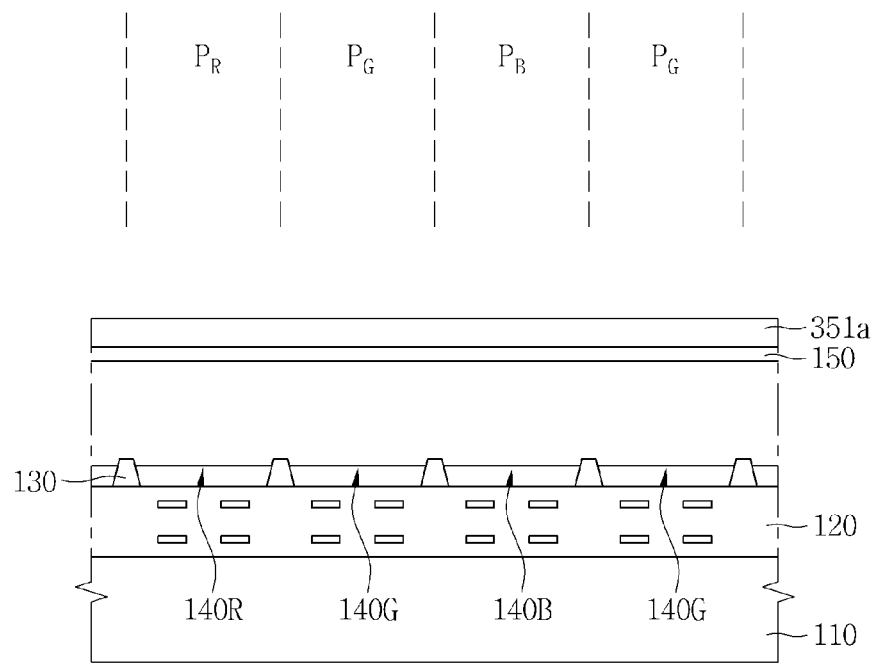
Figure 16B:
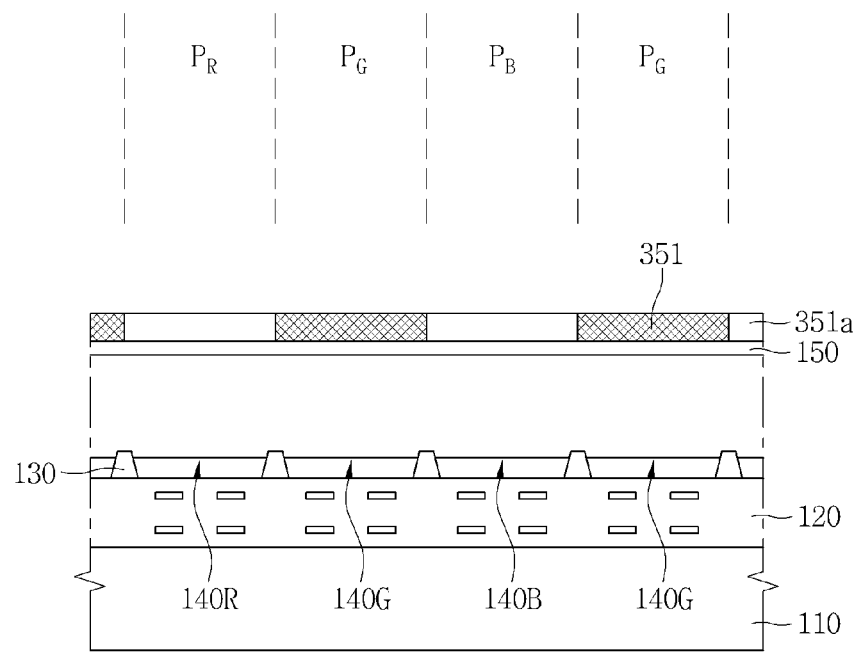

Referring to FIG. 16B, the method of forming the electronic device in accordance with the exemplary embodiment may include forming lower green organic color filters 351 on the green pixel areas $P_G$ in which the green photoelectric conversion devices 140G are located.

The forming of the lower green organic color filters 351 may include exposing the preliminary lower green organic filter layer 351a located on the green pixel areas $P_G$.

Figure 16C:
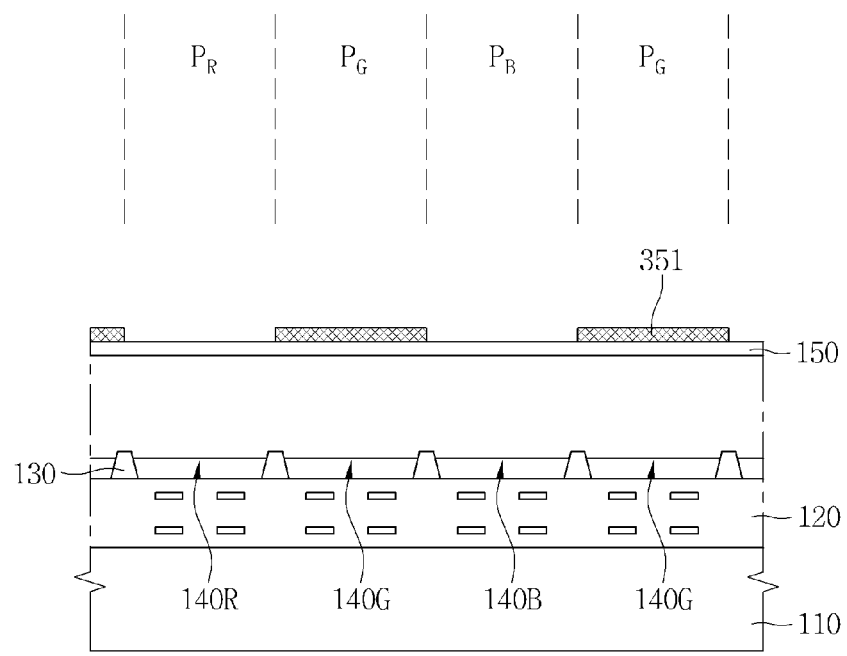

Referring to FIG. 16C, the method of forming the electronic device in accordance with the exemplary embodiment may include removing the unexposed preliminary lower green organic filter layer 351a.

Figure 16D:
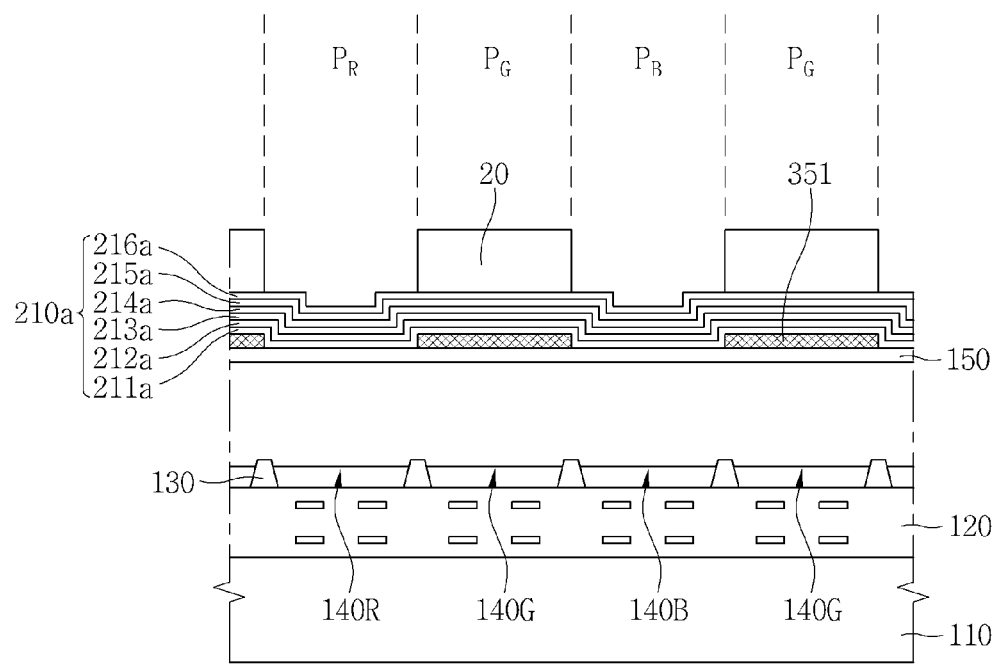

Referring to FIG. 16D, the method of forming the electronic device in accordance with the exemplary embodiment may include forming a preliminary green inorganic filter layer 210a on the lower green organic color filters 351, and forming a green mask pattern 20 on the preliminary green inorganic filter layer 210a.

The preliminary green inorganic filter layer 210a may include a first preliminary green inorganic filter layer 211a, a second preliminary green inorganic filter layer 212a, a third preliminary green inorganic filter layer 213a, a fourth preliminary green inorganic filter layer 214a, a fifth preliminary green inorganic filter layer 215a, and a sixth preliminary green inorganic filter layer 216a. Here, six layers are described; however, the number of layers is not particularly limited and may be more or less than six.

The green mask pattern 20 may be formed on green pixel areas $P_G$. The green pixel areas $P_G$ may be completely covered by the green mask pattern 20.

Figure 16E:
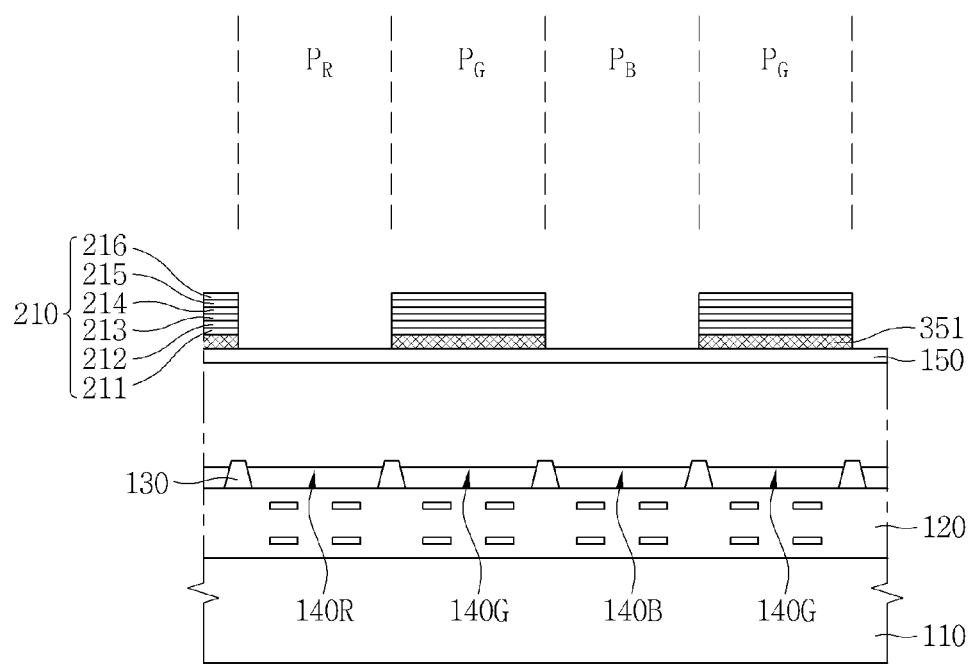

Referring to FIG. 16E, the method of forming the electronic device in accordance with the exemplary embodiment may include forming green inorganic color filters 210 on the lower green organic color filters 351.

The forming of the green inorganic color filters 210 may include etching the preliminary green inorganic filter layer 210a using the green mask pattern 20. Side surfaces of the lower green organic color filters 351 may be vertically aligned with side surfaces of the green inorganic color filters 210.

Each green inorganic color filter 210 may include a first green inorganic color filter layer 211, a second green inorganic color filter layer 212, a third green inorganic color filter layer 213, a fourth green inorganic color filter layer 214, a fifth green inorganic color filter layer 215, and a sixth green inorganic color filter layer 216. Here, six layers are described; however, the number of layers is not particularly limited and may be more or less than six.

Referring to FIG. 6, the method of forming the electronic device in accordance with the exemplary embodiment may include forming the red color filters $CF_R$, forming the blue color filters $CF_B$, forming the green color filters $CF_G$, forming the planarization layer 400, and forming the microlenses 500. The formation of these components occurs similarly to the exemplary embodiment described with reference to FIGS. 15A-15H and therefore repeated description will be omitted for concision.

The forming of the green color filters $CF_G$ may include forming upper green organic color filters 352 on the green inorganic color filters 210. The formation of these components occurs similarly to the exemplary embodiment described with reference to FIGS. 15A-15H and therefore repeated description will be omitted for concision.

FIGS. 17A to 17E are cross-sectional views sequentially showing a method of forming an electronic device in accordance with still another exemplary embodiment.

The method of forming the electronic device in accordance with the exemplary embodiment will be described with reference to FIGS. 9, and 17A to 17E. First, referring to FIG. 17A, the method of forming the electronic device in accordance with the exemplary embodiment may include preparing a support substrate 110 on which an interlayer insulating layer 120, isolation structures 130, red photoelectric conversion devices 140R, blue photoelectric conversion devices 140B, green photoelectric conversion devices 140G, and a buffer layer 150 are formed, forming a preliminary lower green organic filter layer 381a on the buffer layer 150 of the support substrate 110, forming a preliminary lower green inorganic filter layer 270a on the preliminary lower green organic filter layer 381a, forming a preliminary intermediate green organic filter layer 382a on the preliminary lower green inorganic filter layer 270a, forming a preliminary upper green inorganic filter layer 280a on the preliminary intermediate green organic filter layer 382a, and forming a preliminary upper green organic filter layer 383a on the preliminary upper green inorganic filter layer 280a.

The preliminary lower green inorganic filter layer 270a may include a first preliminary lower green inorganic filter layer 271a and a second preliminary lower green inorganic filter layer 272a. The preliminary upper green inorganic filter layer 280a may include a first preliminary upper green inorganic filter layer 281a and a second preliminary upper green inorganic filter layer 282a. Here, two layers are described; however, the number of layers is not particularly limited.

Figure 17A:
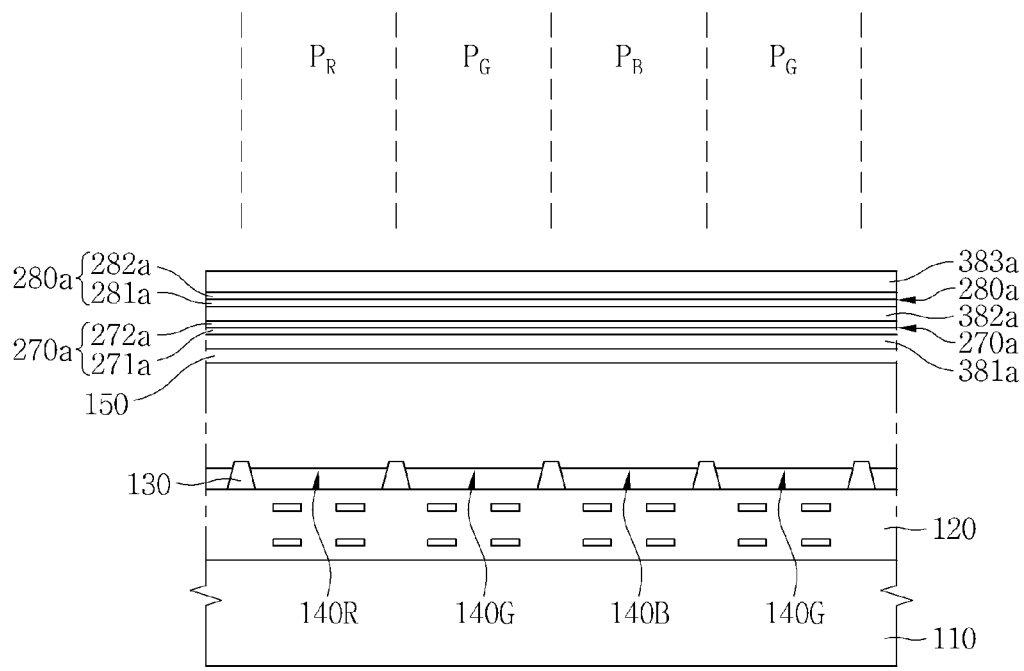
Figure 17B:
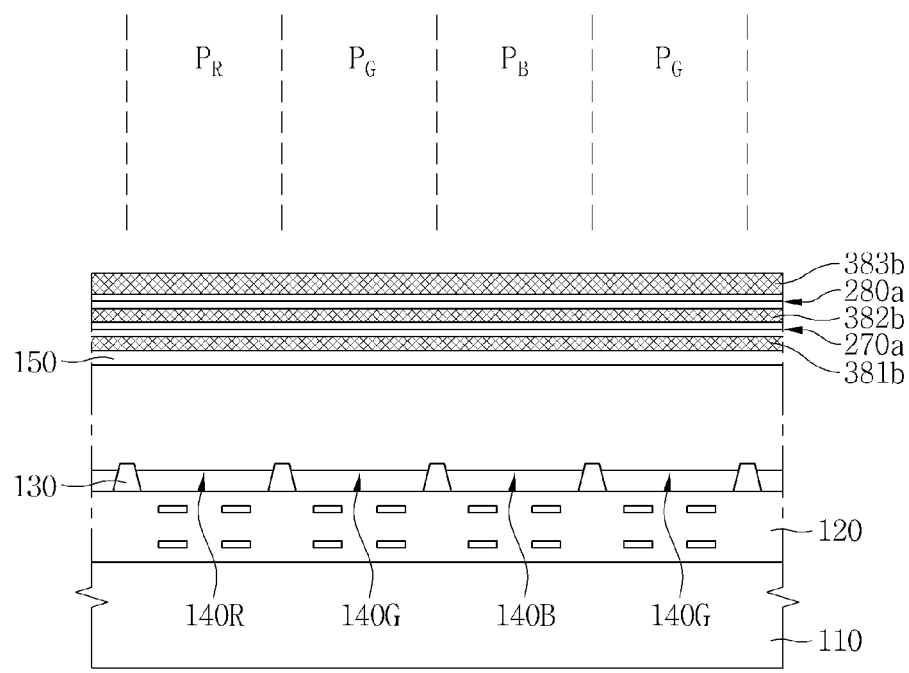

Referring to FIG. 17B, the method of forming the electronic device in accordance with the exemplary embodiment may include forming a lower green organic filter layer 381b, an intermediate green organic filter layer 382b, and an upper green organic filter layer 383b on the buffer layer 150.

The forming of the lower green organic filter layer 381b, the intermediate green organic filter layer 382b, and the upper green organic filter layer 383b may include forming the lower green organic filter layer 381b using the preliminary lower green organic filter layer 381a, forming the intermediate green organic filter layer 382b using the preliminary intermediate green organic filter layer 382a, and forming the upper green organic filter layer 383b using the preliminary upper green organic filter layer 383a.

The forming of the lower green organic filter layer 381b, the intermediate green organic filter layer 382b, and the upper green organic filter layer 383b may be simultaneously performed. For example, the forming of the lower green organic filter layer 381b, the intermediate green organic filter layer 382b, and the upper green organic filter layer 383b may include thermosetting the preliminary lower green organic filter layer 381a, the preliminary intermediate green organic filter layer 382a, and the preliminary upper green organic filter layer 383a.

Figure 17C:
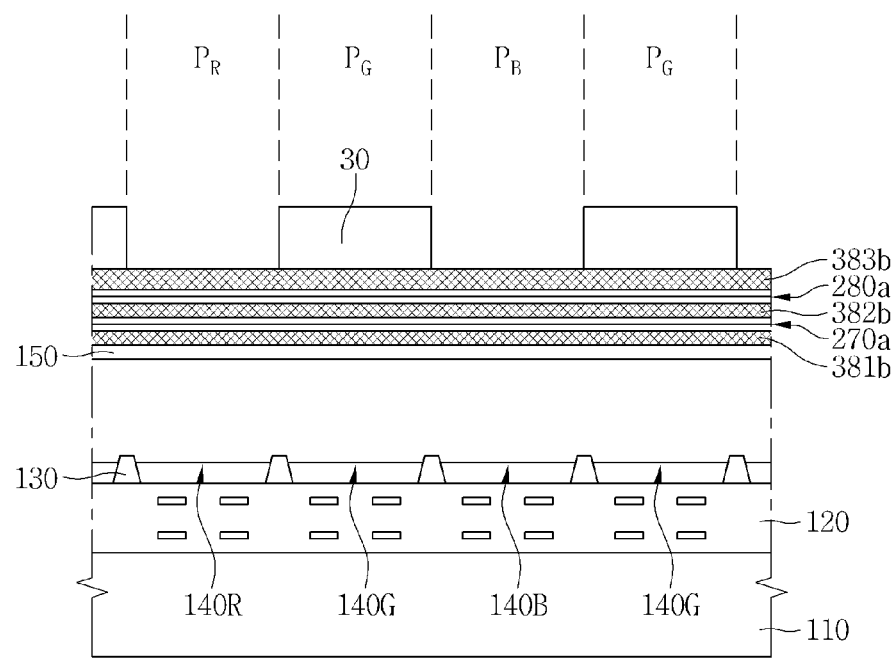

Referring to FIG. 17C, the method of forming the electronic device in accordance with the exemplary embodiment may include forming a green mask pattern 30 on the green pixel areas $P_G$ in which the green photoelectric conversion devices 140G are formed.

Figure 17D:
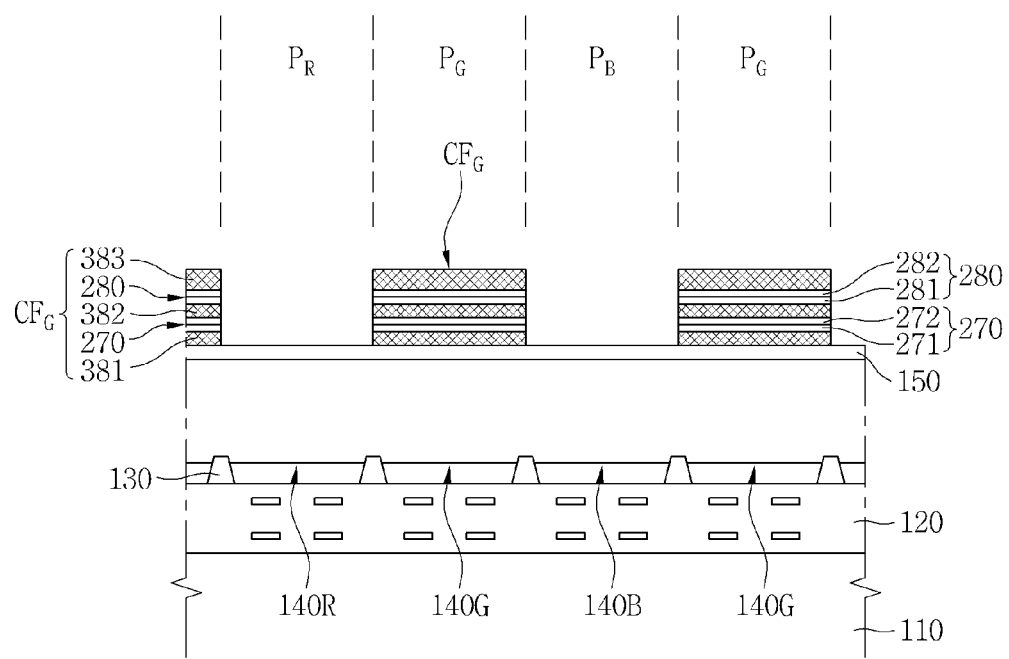

Referring to FIG. 17D, the method of forming the electronic device in accordance with the exemplary embodiment may include forming green color filters $CF_G$ on the green pixel areas $P_G$.

The forming of the green color filters $CF_G$ may include sequentially etching the upper green organic filter layer 383b, the preliminary upper green inorganic filter layer 280a, the intermediate green organic filter layer 382b, the preliminary lower green inorganic filter layer 270a, and the lower green organic filter layer 381b, using the green mask pattern 30.

Each green color filter $CF_G$ may include a lower green organic color filter 381, a lower green inorganic color filter 270, an intermediate green organic color filter 382, an upper green inorganic color filter 280, and an upper green organic color filter 383. A side surface of the lower green organic color filter 381 may be vertically aligned with a side surface of the lower green inorganic color filter 270. The side surface of the lower green inorganic color filter 270 may be vertically aligned with a side surface of the intermediate green organic color filter 382. The side surface of the intermediate green organic color filter 382 may be vertically aligned with a side surface of the upper green inorganic color filter 280. The side surface of the upper green inorganic color filter 280 may be vertically aligned with a side surface of the upper green organic color filter 383.

The lower green inorganic color filter 270 may include a first lower green inorganic color filter layer 271 and a second lower green inorganic color filter layer 272. A side surface of the first lower green inorganic color filter layer 271 may be vertically aligned with a side surface of the second lower green inorganic color filter layer 272.

The upper green inorganic color filter 280 may include a first upper green inorganic color filter layer 281 and a second upper green inorganic color filter layer 282. A side surface of the first upper green inorganic color filter layer 281 may be vertically aligned with a side surface of the second upper green inorganic color filter layer 282.

Figure 17E:
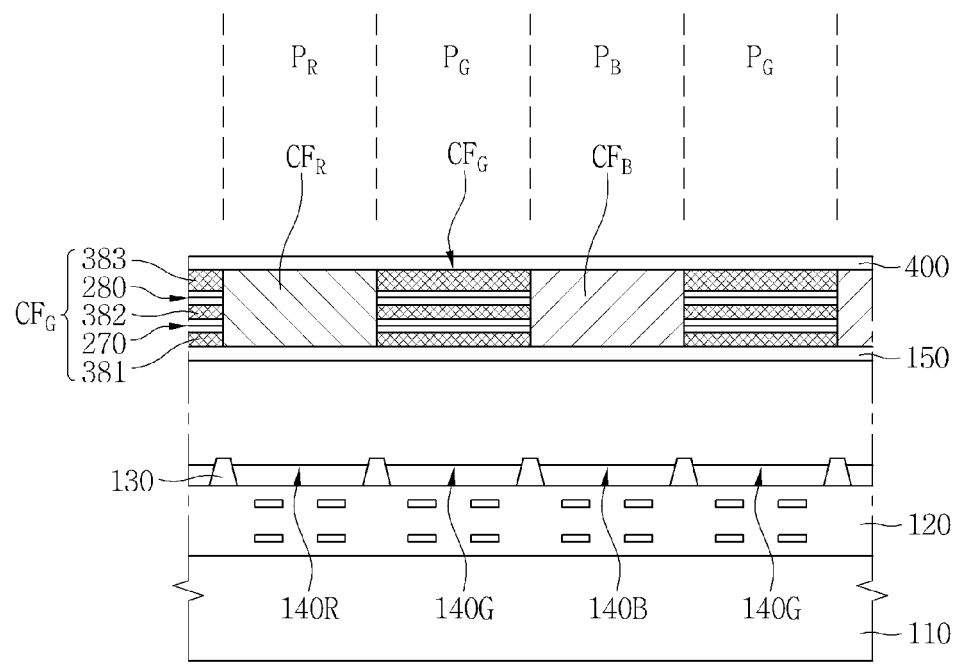

Referring to FIG. 17E, the method of forming the electronic device in accordance with the exemplary embodiment may include forming red color filters $CF_R$, forming blue color filters $CF_B$, and forming a planarization layer 400. The formation of these components occurs similarly to the exemplary embodiment described with reference to FIGS. 15A-15H and therefore repeated description will be omitted for concision.

Referring to FIG. 9, the method of forming the electronic device in accordance with the exemplary embodiment may include forming the micro-lenses 500 on the planarization layer 400. The formation of these components occurs similarly to the exemplary embodiment described with reference to FIGS. 15A-15H and therefore repeated description will be omitted for concision.

FIGS. 18A to 18E are cross-sectional views sequentially showing a method of forming an electronic device in accordance with yet another exemplary embodiment.

The method of forming the electronic device in accordance with the exemplary embodiment will be described with reference to FIGS. 10, and 18A to 18E. First, referring to FIG. 18A, the method of forming the electronic device in accordance with the exemplary embodiment may include preparing a support substrate 110 including red pixel areas $P_R$, blue pixel areas $P_B$, and green pixel areas $P_G$, forming an interlayer insulating layer 120, isolation structures 130, red photoelectric conversion devices 140R, blue photoelectric conversion devices 140B, green photoelectric conversion devices 140G, and a buffer layer 150 on the support substrate 110, forming a preliminary green inorganic filter layer 290a on the buffer layer 150, and forming a green mask pattern 40 on the preliminary green inorganic filter layer 290a.

The preliminary green inorganic filter layer 290a may include a first preliminary green inorganic filter layer 291a, a second preliminary green inorganic filter layer 292a, a third preliminary green inorganic filter layer 293a, a fourth preliminary green inorganic filter layer 294a, a fifth preliminary green inorganic filter layer 295a, and a sixth preliminary green inorganic filter layer 296a. Here, six layers are described; however, the number of layers is not particularly limited.

The green mask pattern 40 may be formed on the green pixel areas $P_G$ of the support substrate 110. An area of each green pixel area $P_G$ may be greater than an area of the green mask pattern 40 located on the green pixel area $P_G$. The green mask pattern 40 may partially cover the green pixels $P_G$. For example, an edge of the green pixel area $P_G$ may not be covered by the green mask pattern 40.

Figure 18A:
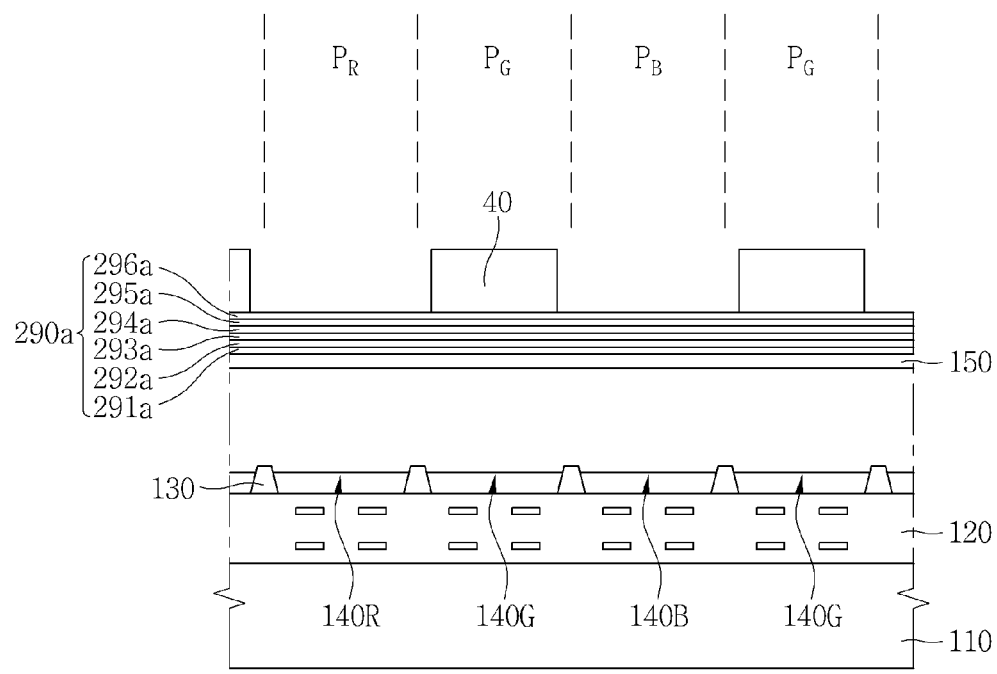
Figure 18B:
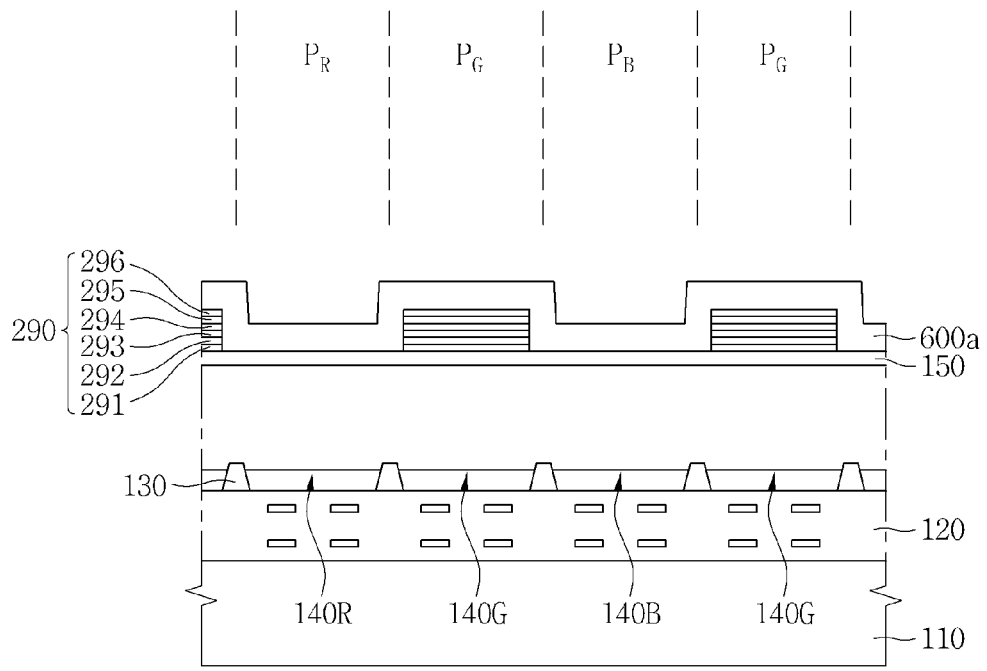

Referring to FIG. 18B, the method of forming the electronic device in accordance with the exemplary embodiment may include forming green inorganic color filters 290 on the buffer layer 150, removing the green mask pattern 40, and forming a metal layer 600a on the green inorganic color filters 290.

The forming of the green inorganic color filters 290 may include etching the preliminary green inorganic filter layer 290a using the green mask pattern 40. Each green inorganic green filter 290 may include a first green inorganic green filter layer 291, a second green inorganic green filter layer 292, a third green inorganic green filter layer 293, a fourth green inorganic green filter layer 294, a fifth green inorganic green filter layer 295, and a sixth green inorganic green filter layer 296. Here, six layers are described; however, the number of layers is not particularly limited. A maximum horizontal width of a lower surface of each green inorganic green filter 290 may be smaller than a horizontal width of each green pixel $P_G$.

The forming of the metal layer 600a may include depositing a metal material on the green inorganic color filters 290. For example, the forming of the metal layer 600a may include forming a layer including aluminum (Al), chromium (Cr), molybdenum (Mo), titanium (Ti), or tungsten (W) on the green inorganic color filters 290.

Figure 18C:
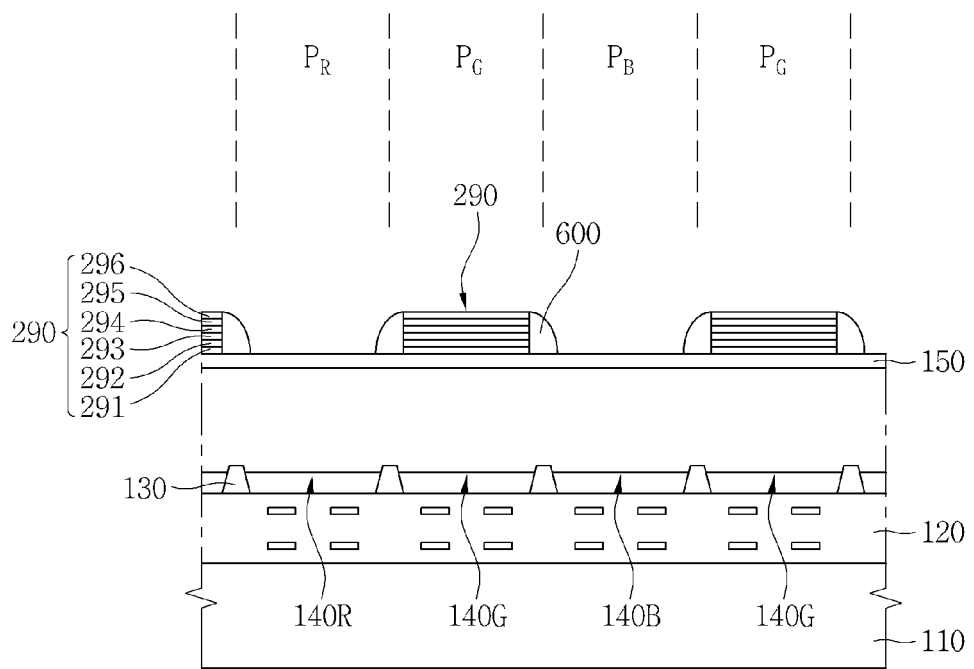

Referring to FIG. 18C, the method of forming the electronic device in accordance with the exemplary embodiment may include forming metal patterns 600 on side surfaces of the green inorganic color filters 290.

The forming of the metal patterns 600 may include blanket etching the metal layer 600a. A cross-section of each metal pattern 600 may have a spacer shape on the side surface of the green inorganic color filter 290.

The metal patterns 600 may partially cover the red pixel areas $P_R$ and the blue pixel areas $P_B$. A maximum horizontal width of an upper surface of the buffer layer 150 exposed by the metal patterns 600 may be the same as a maximum horizontal width of a lower surface of the green inorganic color filter 290 on the red pixel areas $P_R$. A maximum horizontal width of the upper surface of the buffer layer 150 exposed by the metal patterns 600 may be the same as the maximum horizontal width of the lower surface of the green inorganic color filter 290 on the blue pixel areas $P_B$.

Figure 18D:
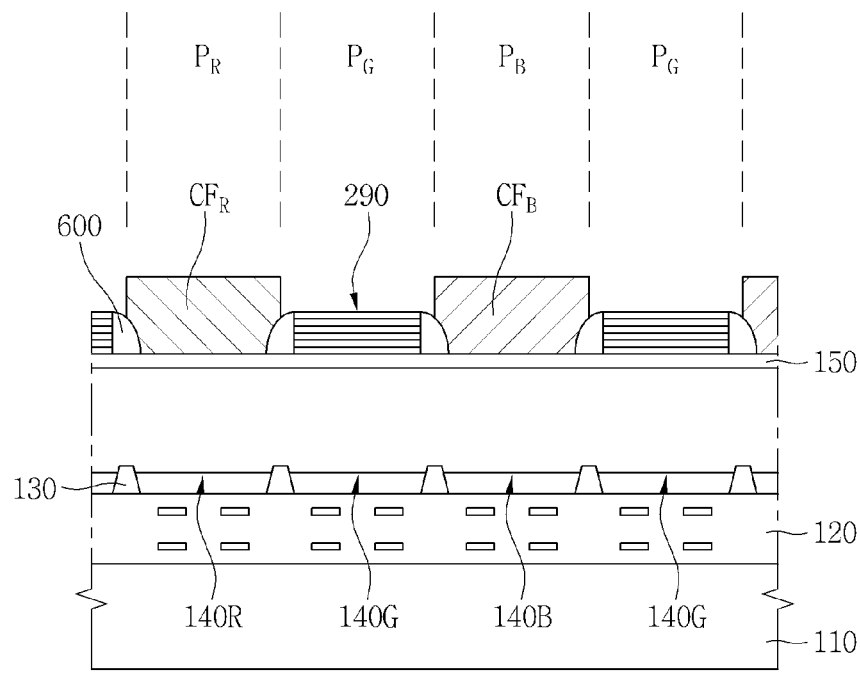

Referring to FIG. 18D, the method of forming the electronic device in accordance with the exemplary embodiment may include forming red color filters $CF_R$ on the red pixel areas $P_R$, and forming blue color filters $CF_B$ on the blue pixel areas $P_B$.

A maximum horizontal width of a lower surface of the red color filter $CF_R$ may be the same as the maximum horizontal width of the lower surface of the green inorganic color filter 290. An upper part of the red color filter $CF_R$ may extend over and on the metal pattern 600. A maximum horizontal width of an upper surface of the red color filter $CF_R$ may be greater than the maximum horizontal width of the lower surface of the red color filter $CF_R$. The maximum horizontal width of the upper surface of the red color filter $CF_R$ may be the same as a horizontal width of the red pixel area $P_R$.

A maximum horizontal width of a lower surface of the blue color filters $CF_B$ may be the same as the maximum horizontal width of the lower surface of the green inorganic color filter 290. An upper part of the blue color filter $CF_B$ may extend over and on the metal pattern 600. A maximum horizontal width of an upper surface of the blue color filter $CF_B$ may be greater than a maximum horizontal width of the lower surface of the blue color filter $CF_B$. The maximum horizontal width of the upper surface of the blue color filter $CF_B$ may be the same as a horizontal width of the blue pixel area $P_B$.

Figure 18E:
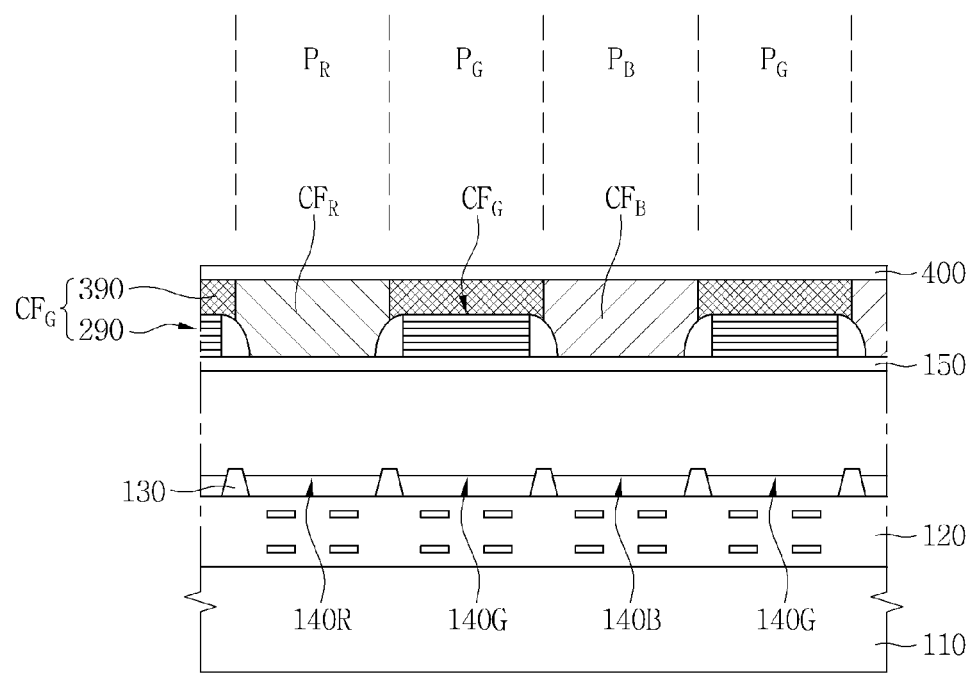

Referring to FIG. 18E, the method of forming the electronic device in accordance with the exemplary embodiment may include forming green color filters $CF_G$ on the green pixel areas $P_G$, and forming a planarization layer 400. The formation of these components occurs similarly to the exemplary embodiment described with reference to FIGS. 15A-15H and therefore repeated description will be omitted for concision.

The forming of the green color filters $CF_G$ may include forming green organic color filters 390 on the green inorganic color filters 290. The formation of these components occurs similarly to the exemplary embodiment described with reference to FIGS. 15A-15H and therefore repeated description will be omitted for concision.

The green organic color filter 390 may extend on the metal pattern 600. A maximum horizontal width of an upper surface of the green organic color filter 390 may be greater than the maximum horizontal width of the lower surface of the green inorganic color filter 290. The maximum horizontal width of the upper surface of the green organic color filter 390 may be the same as a horizontal width of the green pixel area $P_G$. The maximum horizontal width of the upper surface of the green organic color filter 390 may be the same as the maximum horizontal width of the upper surface of the red color filter $CF_R$. The maximum horizontal width of the upper surface of the green organic color filter 390 may be the same as the maximum horizontal width of the upper surface of the blue color filter $CF_B$.

Side surfaces of the green organic color filter 390 may directly contact the side surfaces of the blue color filter $CF_B$ on the metal pattern 600. The side surfaces of the green organic color filter 390 may directly contact the side surfaces of the red color filter $CF_R$ on the metal pattern 600.

Referring to FIG. 10, the method of forming the electronic device in accordance with the exemplary embodiment may include forming the micro-lenses 500 on the planarization layer 400. The formation of these components occurs similarly to the exemplary embodiment described with reference to FIGS. 15A-15H and therefore repeated description will be omitted for concision.

FIGS. 19A to 19G are cross-sectional views sequentially showing a method of forming an electronic device in accordance with yet another exemplary embodiment.

The method of forming the electronic device in accordance with the exemplary embodiment will be described with reference to FIGS. 12, and 19A to 19G. First, referring to FIG. 19A, the method of forming the electronic device in accordance with the exemplary embodiment may include preparing a support substrate 110 on which an interlayer insulating layer 120, isolation structures 130, red photoelectric conversion devices 140R, blue photoelectric conversion devices 140B, green photoelectric conversion devices 140G, and a buffer layer 150 are formed, forming a preliminary share inorganic filter layer 810a on the buffer layer 150 of the support substrate 110, and forming a shared mask pattern 50 on the preliminary share inorganic filter layer 810a.

The preliminary share inorganic filter layer 810a may include a first preliminary shared inorganic filter layer 811a, a second preliminary shared inorganic filter layer 812a, a third preliminary shared inorganic filter layer 813a, a fourth preliminary shared inorganic filter layer 814a, a fifth preliminary shared inorganic filter layer 815a, and a sixth preliminary shared inorganic filter layer 816a. Here, six layers are described; however, the number of layers is not particularly limited.

The red pixel areas $P_R$ and the green pixel areas $P_G$ may be completely covered by the shared mask pattern 50.

Figure 19A:
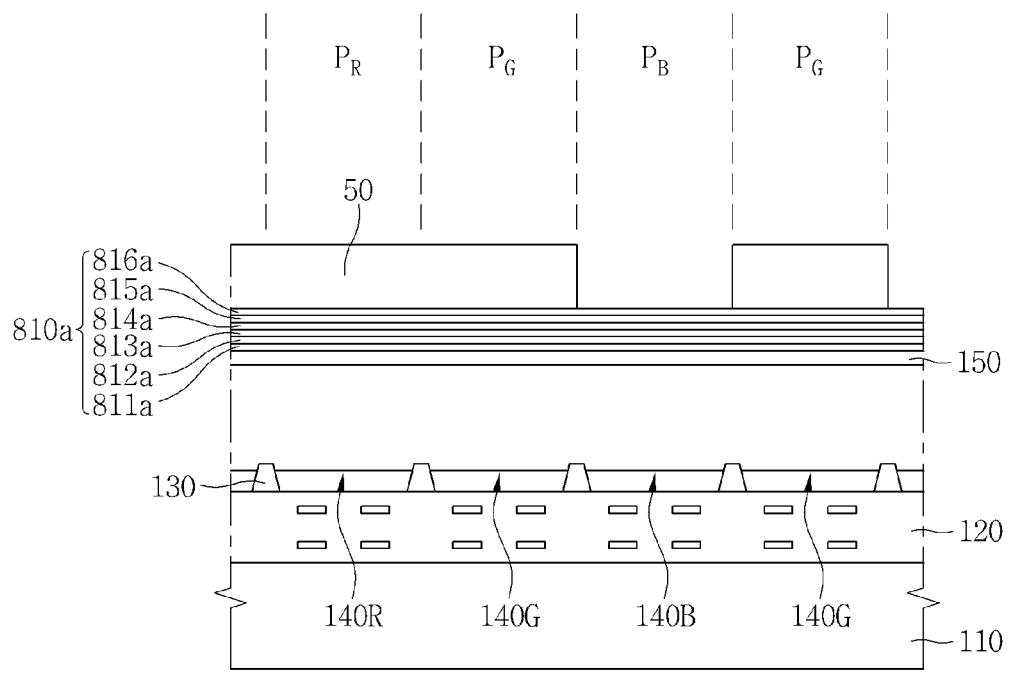
Figure 19B:
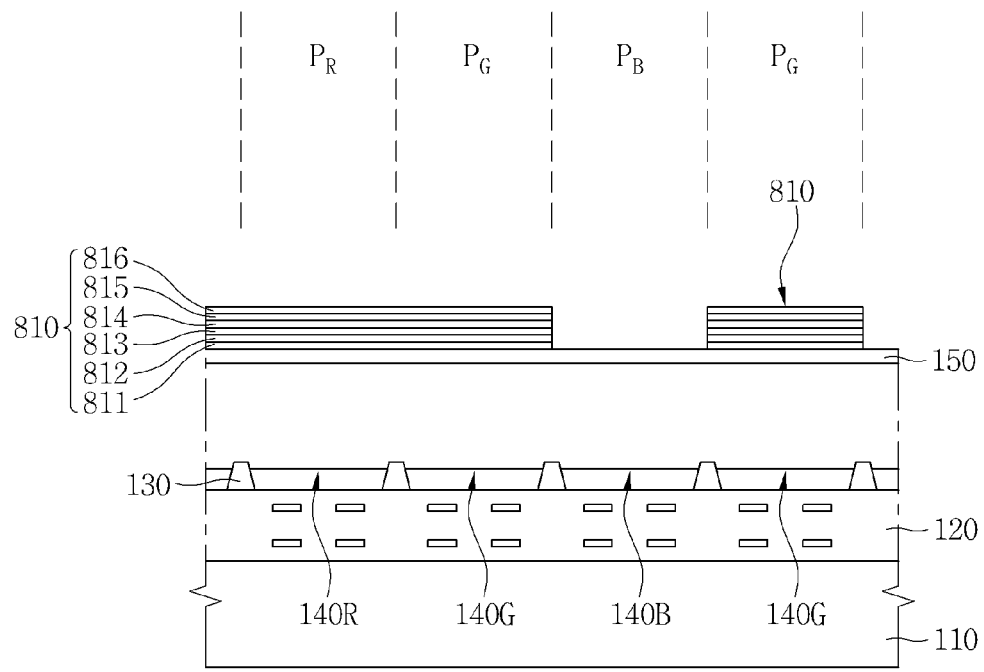

Referring to FIG. 19B, the method of forming the electronic device in accordance with the exemplary embodiment may include forming a shared inorganic color filter 810 on the buffer layer 150, and removing the shared mask pattern 50.

The forming of the shared inorganic color filter 810 may include etching the preliminary shared inorganic filter layer 810a using the shared mask pattern 50. The shared inorganic color filter 810 may include a first shared inorganic color filter layer 811, a second shared inorganic color filter layer 812, a third shared inorganic color filter layer 813, a fourth shared inorganic color filter layer 814, a fifth shared inorganic color filter layer 815, and a sixth shared inorganic color filter layer 816. Here, six layers are described; however, the number of layers is not particularly limited.

Figure 19C:
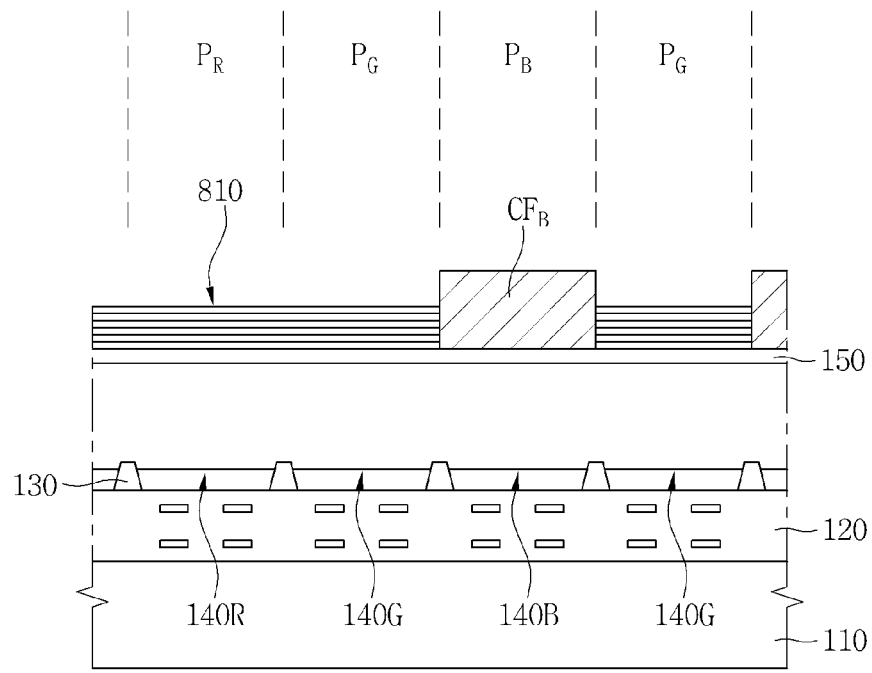

Referring to FIG. 19C, the method of forming the electronic device in accordance with the exemplary embodiment may include forming blue color filters $CF_B$ on the blue pixel areas $P_B$.

Figure 19D:
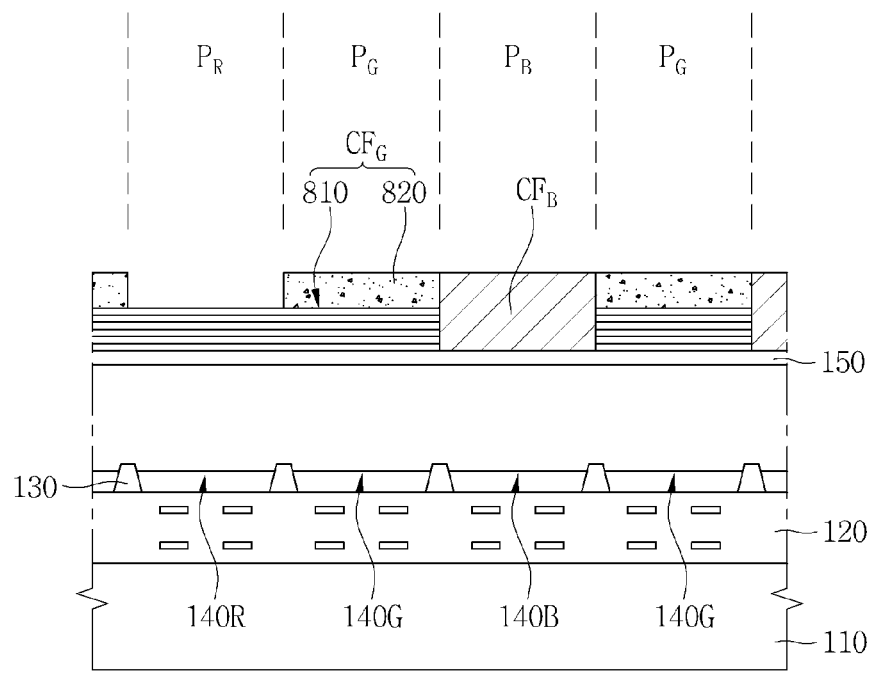

Referring to FIG. 19D, the method of forming the electronic device in accordance with the exemplary embodiment may include forming green color filters $CF_G$ on the green pixel areas $P_G$.

The forming of the green color filters $CF_G$ may include forming a green organic color filter 820 on the shared inorganic color filter 810 located on the green pixel areas $P_G$.

Figure 19E:
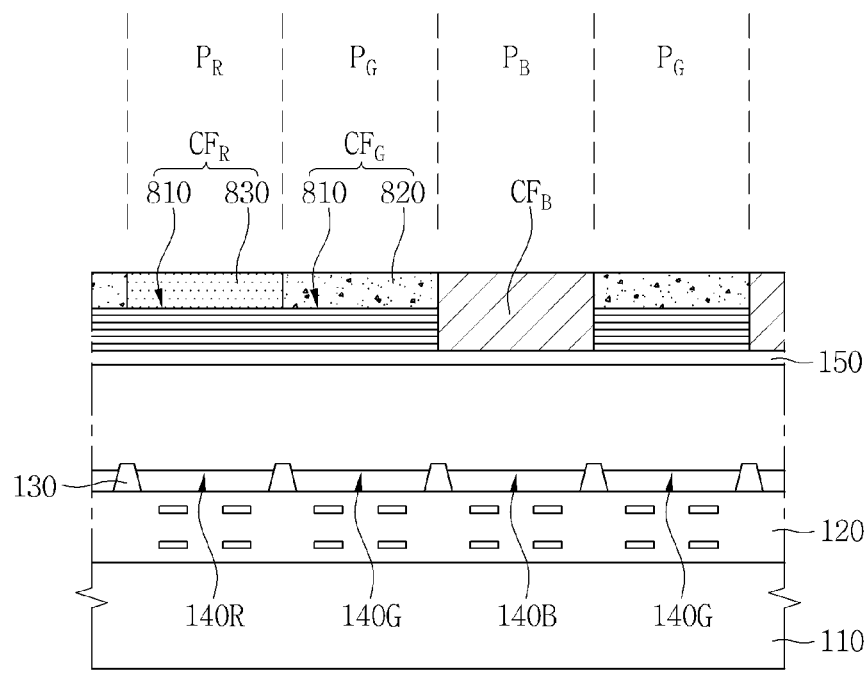

Referring to FIG. 19E, the method of forming the electronic device in accordance with the exemplary embodiment may include forming red color filters $CF_R$ on the red pixel areas $P_R$.

The forming of the red color filters $CF_R$ may include forming a red organic color filter 830 on the shared inorganic color filter 810 located on the red pixel areas $P_R$.

Figure 19F:
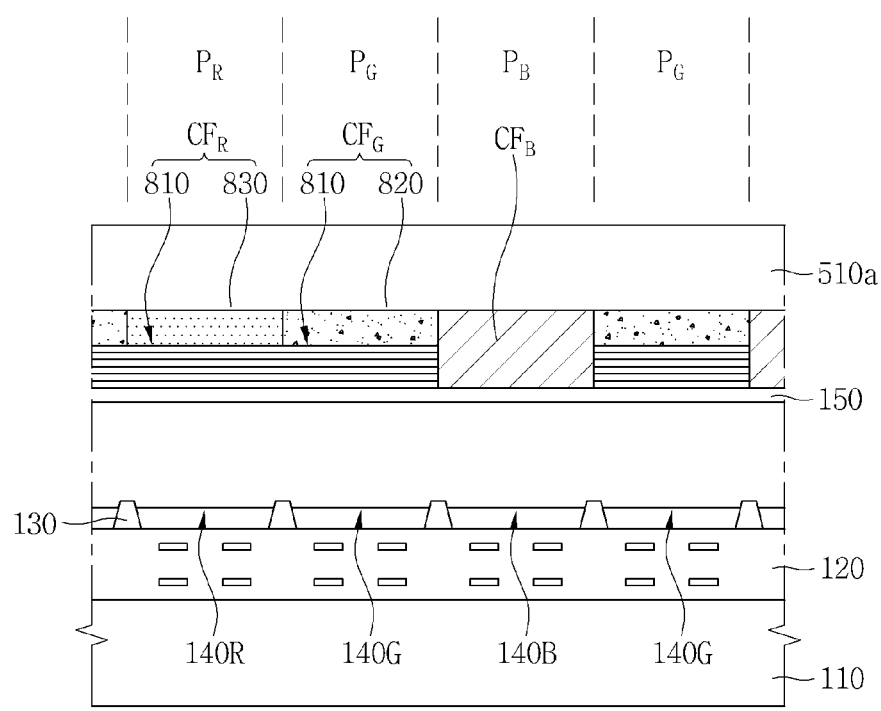

Referring to FIG. 19F, the method of forming the electronic device in accordance with the exemplary embodiment may include forming lens material layer 510a on the red color filters $CF_R$, the blue color filters $CF_B$, and the green color filters $CF_G$.

Figure 19G:
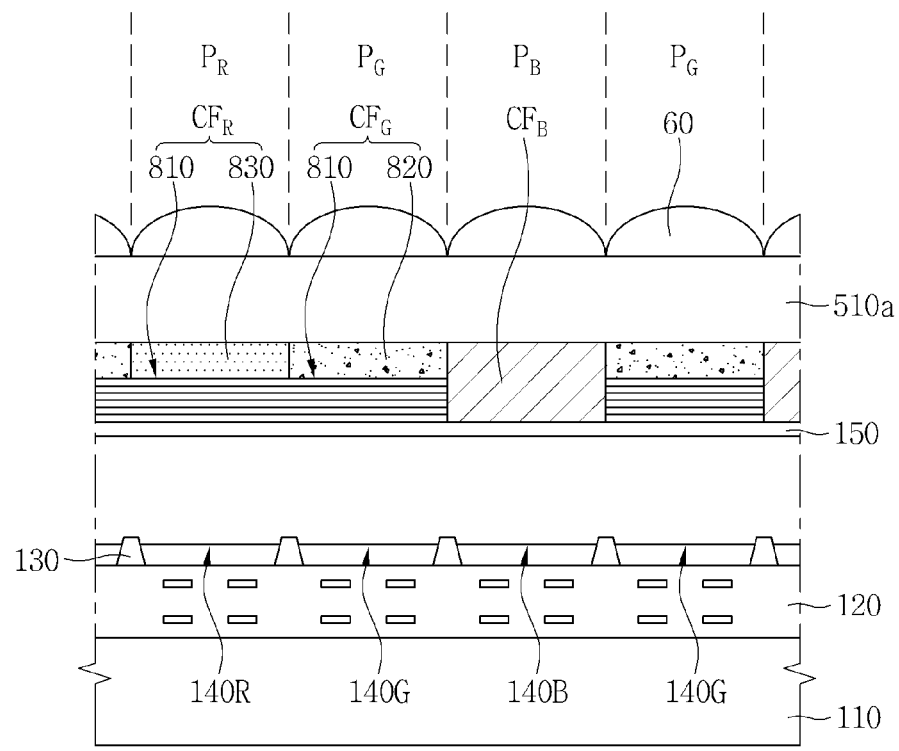

Referring to FIG. 19G, the method of forming the electronic device in accordance with the exemplary embodiment may include forming a lens mask pattern 60 on the lens material layer 510a.

An etch rate of the lens mask pattern 60 may be the same as an etch rate of the lens material layer 510a. A configuration of the lens mask pattern 60 may correspond to a configuration of micro-lenses formed by a subsequent process.

Referring to FIG. 12, the method of forming the electronic device in accordance with the exemplary embodiment may include forming the micro-lenses 510 on the red color filters $CF_R$, the blue color filters $CF_B$, and the green color filters $CF_G$.

The forming of the micro-lenses 510 may include transcribing the configuration of the lens mask pattern 60 to the lens material layer 510a. For example, the forming of the micro-lenses 510 may include blanket etching the lens material layer 510a and the lens mask pattern 60.

Figure 20:
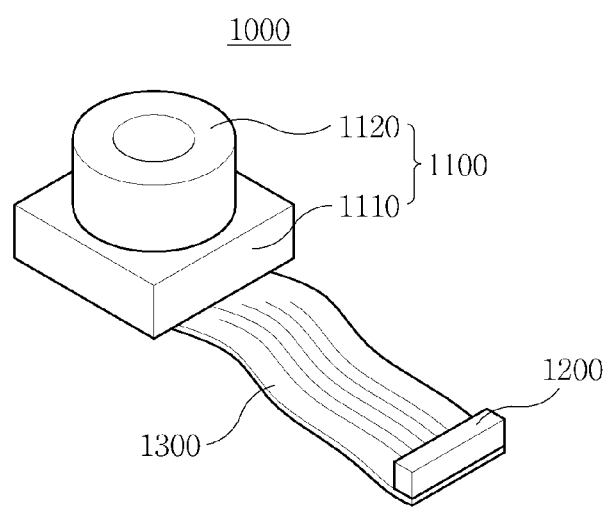
FIG. 20 is a schematic view showing a camera module including an electronic device in accordance with an exemplary embodiment.

FIG. 20 is a schematic view showing a camera module including the electronic device in accordance with an exemplary embodiment.

Referring to FIG. 20, the camera module 1000 may include a body 1100, external terminals 1200, and a printed circuit board 1300. The printed circuit board 1300 may be a flexible printed circuit board. The body 1100 may include an image processor 1110 and a lens part 1120. The image processor 1110 may include the electronic device in accordance with various above-described exemplary embodiments. For example, the image processor 1110 may include an image sensor or a display device in accordance with the above-described exemplary embodiments. Therefore, reliability may be improved in the camera module 1000.

Figure 21:
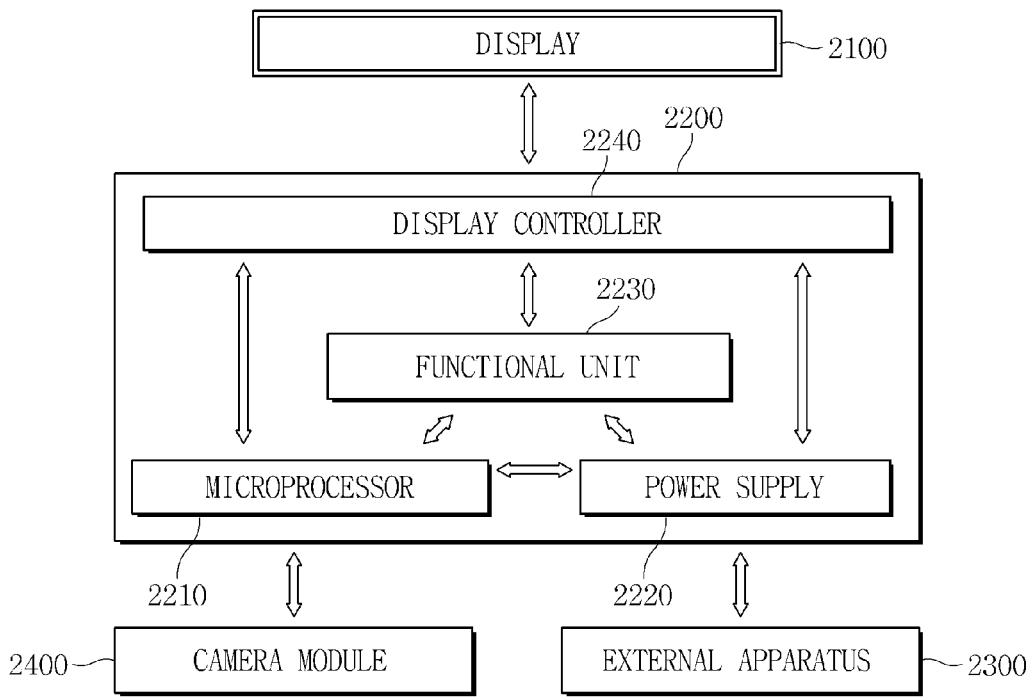
FIG. 21 is a conceptual block diagram showing a mobile system including an electronic device in accordance with an exemplary embodiment.

FIG. 21 is a conceptual block diagram showing a mobile system including the electronic device in accordance with an exemplary embodiment.

Referring to FIG. 21, a mobile system 2000 may include a display 2100, a body 2200, an external apparatus 2300, and a camera module 2400. The body 2200 may include a microprocessor 2210, a power supply 2220, a functional unit 2230, and a display controller 2240.

The display 2100 may be directly connected to the display controller 2240. The display 2100 may display an image processed by the display controller 2240. For example, the display 2100 may include a liquid crystal display device.

The body 2200 may include a system board or a motherboard having a printed circuit board (PCB). The microprocessor 2210, the power supply 2220, the functional unit 2230, and the display controller 2240 may be mounted or disposed on the body 2200.

The microprocessor 2210 may receive a voltage from the power supply 2220 to control the functional unit 2230 and the display controller 2240. The power supply 2220 may receive a constant voltage from an external power supply, divide the voltage into various voltage levels, and supply the voltages to the microprocessor 2210, the functional unit 2230, the display controller 2240, etc.

The power supply 2220 may include a power management IC (PMIC). The PMIC may efficiently supply the voltages to the microprocessor 2210, the functional unit 2230, the display controller 2240, etc.

The functional unit 2230 may perform various functions of the mobile system 2000. For example, the functional unit 2230 may include various components to perform wireless communication functions such as dialing or video output to the display 2100 or voice output to a speaker through communication with the external apparatus 2300. For example, the functional unit 2230 may serve as an image processor of the camera module 2400.

When the mobile system 2000 is connected to a memory card to expand the capacity, the functional unit 2230 may serve as a memory card controller. Further, when the mobile system 2000 uses a Universal Serial Bus (USB) to extend the functions of the mobile system 2000, the functional unit 2230 may serve as an interface controller.

The display 2100 and the camera module 2400 may include the electronic device in accordance with various above-described exemplary embodiments. Therefore, reliability may be improved in the mobile system 2000.

Figure 22:
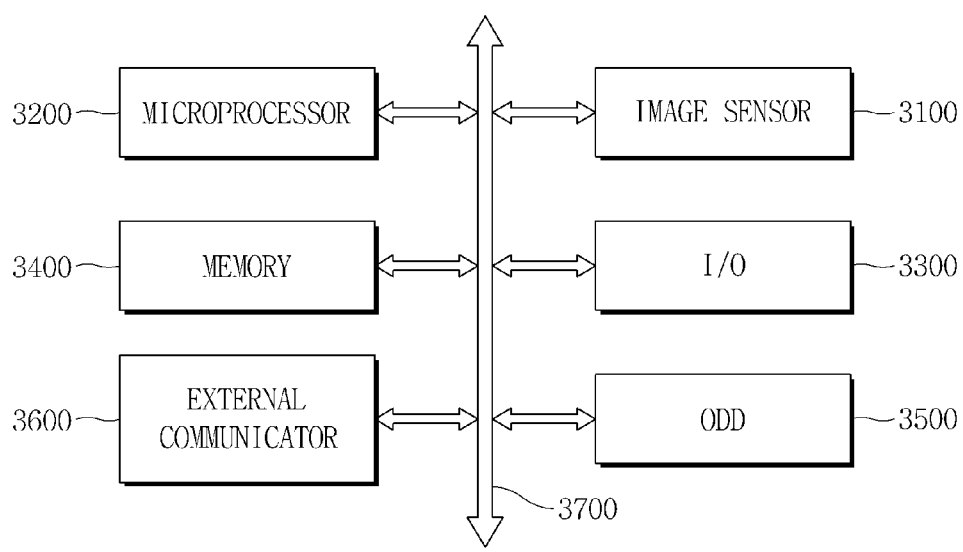
FIG. 22 is a conceptual block diagram showing an electronic system including an electronic device in accordance with an exemplary embodiment.

FIG. 22 is a conceptual block diagram showing an electronic system including the electronic device in accordance with an exemplary embodiment.

Referring to FIG. 22, the electronic system 3000 may include an image sensor 3100, a microprocessor 3200, an input/output (I/O) 3300, a memory 3400, and a bus 3700.

The image sensor 3100 may generate a signal according to incident light, and transfer the signal to the microprocessor 3200. The microprocessor 3200 may program and control the electronic system 3000. The I/O 3300 may perform data communication using the bus 3700. The I/O 3300 may be used to input or output data to or from the electronic system 3000. The memory 3400 may store operational codes of the microprocessor 3200, data processed by the microprocessor 3200, or data received from the outside. The memory 3400 may include a controller and a memory. The image sensor 3100, the microprocessor 3200, the I/O 3300, and the memory 3400 may communicate through the bus 3700.

The electronic system 3000 may further include an optical disk drive (ODD) 3500 and an external communicator 3600. The ODD 3500, for example, may include a CD-ROM drive, a DVD drive, etc. The external communicator 3600 may include a modem, a LAN card, or a USB, and further include an external memory, a WiBro communication device, an infrared communication device, etc.

The 3100 may include the electronic device in accordance with various above-described exemplary embodiments. Therefore, reliability may be improved in the electronic system 3000.

According to the electronic device and the method of forming the same in accordance with the above-described exemplary embodiments, a loss of light due to a color filter can be reduced. According to the electronic device and the method of forming the same in accordance with the above-described exemplary embodiments, optical cross talk between adjacent pixels can be reduced. Therefore, according to the electronic device and the method of forming the same in accordance with the above-described exemplary embodiments, reliability can be improved.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:
1. An electronic device comprising:
a first inorganic color filter including a first surface on which light is incident and a second surface opposite the first surface;
a first organic color filter disposed on the first surface of the first inorganic color filter;
a second inorganic color filter disposed between the first inorganic color filter and the first organic color filter; and
an intermediate organic color filter disposed between the first inorganic color filter and the second inorganic color filter,
wherein a first color filter thickness of the first organic color filter in a direction orthogonal to the first surface is less than a first inorganic filter thickness of the first inorganic color filter,
wherein an intermediate filter thickness of the intermediate organic color filter in the direction orthogonal to the first surface is less than the first color filter thickness of the first organic color filter, and
wherein the first inorganic color filter includes a plurality of layers.
2. The electronic device according to claim 1, further comprising
a second organic color filter disposed on the second surface of the first inorganic color filter.

3. The electronic device according to claim 2, wherein a second color filter thickness of the second organic color filter in the direction orthogonal to the first surface is less than the first color filter thickness of the first organic color filter.

4. The electronic device according to claim 1, wherein a second inorganic filter thickness of the second inorganic color filter in the direction orthogonal to the first surface is greater than the intermediate filter thickness of the intermediate organic color filter.

5. The electronic device according to claim 1, further comprising
a buffer layer disposed under the first inorganic color filter.

6. The electronic device according to claim 1, further comprising
a planarization layer disposed on the first organic color filter.

7. An electronic device, comprising:
a substrate including a first pixel area and a second pixel area;
a first organic color filter disposed on the first pixel area of the substrate;
a second organic color filter disposed on the second pixel area of the substrate; and
an inorganic color filter disposed between the substrate and the second organic color filter,
wherein a progress direction of light penetrating the inorganic color filter is a direction orthogonal to the substrate,
wherein the inorganic color filter includes a plurality of layers, and
wherein a first level of a first lower surface of the first organic color filter in a first substrate direction toward the substrate is the same as a second level of a second lower surface of the inorganic color filter in the first substrate direction.

8. The electronic device according to claim 7, wherein a second organic filter thickness of the second organic color filter is less than a first organic filter thickness of the first organic color filter in an orthogonal direction orthogonal to the substrate.

9. The electronic device according to claim 7, further comprising
a metal pattern disposed between the inorganic color filter and the first organic color filter.

10. The electronic device according to claim 9, wherein a metal pattern thickness of the metal pattern in an orthogonal direction orthogonal to the substrate decreases as a distance in a direction parallel to the substrate increases from the inorganic color filter.

11. The electronic device according to claim 9, wherein the first organic color filter and the second organic color filter extend over and on the metal pattern.

12. The electronic device according to claim 11, wherein a second side surface of the second organic color filter directly contacts a first side surface of the first organic color filter over and on the metal pattern.

13. The electronic device according to claim 7, wherein a second upper surface level of a second upper surface of the second organic color filter in a second substrate direction away from the substrate is the same as a first upper surface level of a first upper surface of the first organic color filter in the second substrate direction.

14. An electronic device comprising:
a substrate including a green pixel area, a blue pixel area, and a red pixel area;
a red organic filter disposed on the substrate in the red pixel area;
a green organic filter disposed on the substrate in the green pixel area;
a blue organic filter disposed on the substrate in the blue pixel area; and
an inorganic color filter disposed between the substrate and at least one of the red organic filter, the green organic filter, and the blue organic filter,
wherein the inorganic color filter includes a plurality of layers, and
wherein a first level of a first lower surface of the inorganic color filter in a first substrate direction toward the substrate is the same as a second level of a second lower surface of the at least one of the red organic filter, the green organic filter, and the blue organic filter that does not have the inorganic color filter, in the first substrate direction.

15. The electronic device according to claim 14, wherein the inorganic color filter is disposed between the substrate and two of the red organic filter, the green organic filter, and the blue organic filter so as to be shared between the two.

16. The electronic device according to claim 14, wherein the substrate includes a plurality of green pixel areas, a plurality of blue pixel areas, and a plurality of red pixel areas, wherein the plurality of green pixel areas are arranged in diagonal directions.

17. The electronic device according to claim 16, wherein the plurality of red pixel areas are arranged between the plurality of green pixel areas in a horizontal direction.

18. The electronic device according to claim 17, wherein the plurality of red pixel areas are arranged only between the plurality of green pixel areas in the horizontal direction.

19. The electronic device according to claim 14, wherein the substrate includes a plurality of pixel areas arranged in an array, and the plurality of pixel areas comprises a plurality of green pixel areas, a plurality of blue pixel areas, and a plurality of red pixel areas, wherein:
the plurality of green pixel areas are arranged in diagonal directions in the array,
the plurality of red pixel areas are arranged between the plurality of green pixel areas in even numbered horizontal lines of the array, and
the plurality of blue pixel areas are arranged between the plurality of green pixel areas in odd numbered horizontal lines of the array.

20. The electronic device according to claim 14, wherein the substrate includes a plurality of pixel areas arranged in an array, and the plurality of pixel areas comprises a plurality of green pixel areas, a plurality of blue pixel areas, and a plurality of red pixel areas, wherein:
the plurality of red pixel areas, the plurality of green pixel areas, and the plurality of blue pixel areas are arranged in columns of the array respectively.

21. The electronic device according to claim 14, wherein a first upper surface level of a first upper surface in a second substrate direction of the at least one of the red organic filter, the green organic filter, and the blue organic filter having the inorganic color filter is the same as a second upper surface level of a second surface in the second substrate direction of another of the at least one of the red organic filter, the green organic filter, and the blue organic filter that does not have the inorganic color filter.

* * * * *